(12) United States Patent
Matsukawa et al.

(10) Patent No.: US 10,305,397 B2
(45) Date of Patent: May 28, 2019

(54) VIBRATION ACTUATOR UNIT, STAGE APPARATUS, AND OPTICAL APPARATUS

(71) Applicant: NIKON CORPORATION, Chiyoda-ku, Tokyo (JP)

(72) Inventors: Eiji Matsukawa, Yotsukaido (JP); Masaaki Kusano, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 1057 days.

(21) Appl. No.: 14/570,300

(22) Filed: Dec. 15, 2014

(65) Prior Publication Data

US 2015/0200612 A1 Jul. 16, 2015

Related U.S. Application Data

(63) Continuation of application No. PCT/JP2013/003470, filed on May 31, 2013.

(30) Foreign Application Priority Data

Jun. 18, 2012 (JP) .................................. 2012-136989
Jul. 20, 2012 (JP) .................................. 2012-161999

(51) Int. Cl.
*H02N 2/00* (2006.01)
*H02N 2/02* (2006.01)
(Continued)

(52) U.S. Cl.
CPC ................. *H02N 2/14* (2013.01); *G02B 7/08* (2013.01); *G02B 7/10* (2013.01); *H01L 41/0913* (2013.01);
(Continued)

(58) Field of Classification Search
CPC combination set(s) only.
See application file for complete search history.

(56) References Cited

U.S. PATENT DOCUMENTS 5,325,010 A * 6/1994 Besocke .................... B25J 7/00
310/317
5,453,653 A * 9/1995 Zumeris .............. H01L 41/0913
310/323.16
(Continued)

FOREIGN PATENT DOCUMENTS

JP 07-184382 A 7/1995
JP H07-184382 * 7/1995 ............. H01L 41/09
(Continued)

OTHER PUBLICATIONS

Chinese Office Action and English translation issued in co-pending application No. 201380043409.5 dated Jul. 7, 2017.
(Continued)

*Primary Examiner* — Thomas M Dougherty
*Assistant Examiner* — Karen B Addison
(74) *Attorney, Agent, or Firm* — Foley & Lardner LLP

(57) ABSTRACT

A vibration actuator unit includes: an electromechanical converting element that converts an electric vibration of an applied actuating voltage into a mechanical vibration; and a contact portion that contacts an actuated surface of an actuating subject and a transmits a mechanical vibration of the electromechanical converting element to the actuated surface as an actuating force, wherein the electromechanical converting element periodically bends within a first vibration plane crossing the actuated surface to vibrate the contact portion within the first vibration plane, and periodically bends within a second vibration plane crossing the first vibration plane to vibrate the contact portion within the second vibration plane.

10 Claims, 27 Drawing Sheets

(51) Int. Cl.
*H02N 2/14* (2006.01)
*H01L 41/09* (2006.01)
*G02B 7/08* (2006.01)
*G02B 7/10* (2006.01)

(52) U.S. Cl.
CPC .......... *H02N 2/004* (2013.01); *H02N 2/0095* (2013.01); *H02N 2/026* (2013.01); *H02N 2/028* (2013.01)

(56) References Cited

U.S. PATENT DOCUMENTS

| | | |
|---|---|---|
| 5,616,980 A | 4/1997 | Zumeris |
| 5,682,076 A | 10/1997 | Zumeris |
| 5,714,833 A | 2/1998 | Zumeris |
| 5,777,423 A | 7/1998 | Zumeris |
| 5,877,579 A | 3/1999 | Zumeris |
| 6,064,140 A | 5/2000 | Zumeris |

FOREIGN PATENT DOCUMENTS

| | | |
|---|---|---|
| JP | 11-316607 A | 11/1999 |
| JP | 2003-324978 A | 11/2003 |
| JP | 2006-261141 A | 9/2006 |
| JP | 2010-279152 A | 12/2010 |
| JP | 2011-147266 A | 7/2011 |

OTHER PUBLICATIONS

Chinese Office Action and English translation issued in co-pending application No. 201380043409.5 dated Oct. 9, 2016.
Chinese Office Action issued in co-pending Chinese Application No. 201380043409.5 dated Mar. 12, 2018.
Translation of Written Opinion of the International Searching Authority and the International Preliminary Report on Patentability for PCT/JP2013/003470, dated Dec. 31, 2014 and International Search Report dated Aug. 6, 2013 for the same (9 pages).

* cited by examiner

VIBRATION ACTUATOR UNIT, STAGE APPARATUS, AND OPTICAL APPARATUS

CROSS-REFERNCE TO RELATED APPLICATIONS

The contents of the following Japanese patent application(s) are incorporated herein by reference:
2012-136989 filed in JP on Jun. 18, 2012;
2012-161999 filed in JP on Jul. 20, 2012; and
PCT/JP2013/003470 filed on May 31, 2013

BACKGROUND

1. Technical Field

The present invention relates to a vibration actuator unit, a stage apparatus, and an optical apparatus.

2. Related Art

There is a stage apparatus which moves a stage two-dimensionally (for example, refer to Patent Literature 1). Furthermore, there is an actuating apparatus provided with a scale and an encoder for detecting a displacement signal to control an actuating signal based on the displacement signal (for example, refer to Patent Literature 2).

Patent Literature 1: Japanese Patent Application Publication No. H11-316607
Patent Literature 2: Japanese Patent Application Publication No. 2011-147266

SUMMARY

As provided with actuators for actuating in a X direction and actuating in a Y direction respectively, the apparatus is large in scale. Addition of a scale and an encoder further increases a cost and a space factor.

A first aspect of the present invention provides a vibration actuator unit comprising: an electromechanical converting element that converts an electric vibration of an applied actuating voltage into a mechanical vibration; and a contact portion that contacts an actuated surface of an actuating subject and a transmits a mechanical vibration of the electromechanical converting element to the actuated surface as an actuating force, wherein the electromechanical converting element periodically bends within a first vibration plane crossing the actuated surface to vibrate the contact portion within the first vibration plane, and periodically bends within a second vibration plane crossing the first vibration plane to vibrate the contact portion within the second vibration plane.

A second aspect of the present invention provided an optical apparatus comprising the aforementioned vibration actuator unit. Furthermore, a third aspect of the present invention provides a stage apparatus comprising the aforementioned vibration actuator unit.

A fourth aspect of the present invention provides a vibration actuator unit comprising: an electromechanical converting element that converts an applied actuating power into a mechanical vibration; a contacting portion that actuates an actuating subject article when a mechanical vibration is transmitted from the electromechanical converting element; a biasing force generating portion that generates a biasing force biasing the contacting portion toward the actuating subject article; and a position detecting portion that detects, based on a change in a physical amount to be a biasing force generated by the biasing force generating portion, a relative position between the actuating subject article and the electromechanical converting element.

A fifth aspect of the present invention provides an optical apparatus comprising the aforementioned vibration actuator unit. Furthermore, the sixth aspect of the present invention provides a stage apparatus comprising the aforementioned vibration actuator unit.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
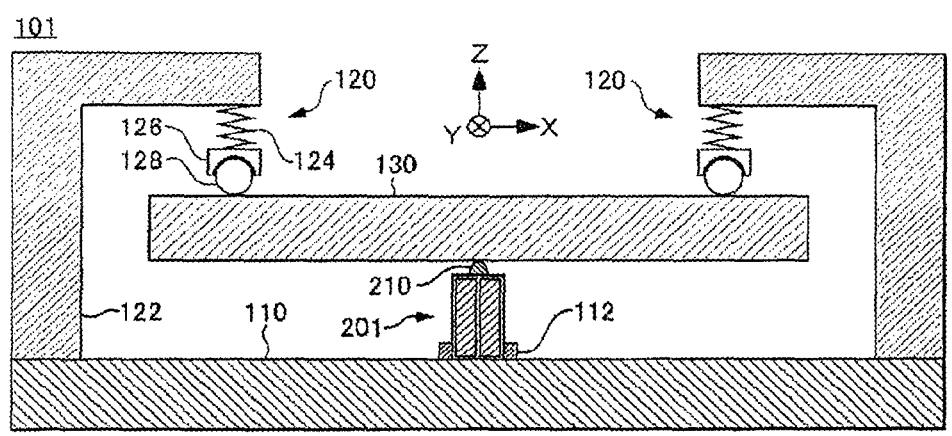
FIG. 1 is a schematic cross sectional view of a stage apparatus 101.

FIG. 1 is a schematic cross sectional view of a stage apparatus 101. The stage apparatus 101 comprises a base 110, biasing portions 120, a moving stage 130 and a vibration actuator unit 201.

In the stage apparatus 101, the biasing portions 120 and the vibration actuator unit 201 are provided on a flat upper surface of the base 110. The vibration actuator unit 201 is fixed to the upper surface of the base 110 with a fixing portion 112. The moving stage 130 is supported by the vibration actuator unit 201 from a downward side.

The biasing portions 120 have a strut 122, an elastic member 124, a spherical seat 126 and a rotation ball 128. The strut 122 extends from the upper surface of the base 110 upwardly in the figure, and also extends laterally to overhang the moving stage 130 in the figure. Between a distal end of the strut 122 and an upper surface of the moving stage 130, the elastic member 124, the spherical seat 126 and the rotation ball 128 are stacked.

The rotation ball 128 contacts the upper surface of the moving stage 130. The spherical seat 126 prevents the rotation ball 128 from displacement on an outer surface of the moving stage 130, while it allows for rotation of the rotation ball 128. The elastic member 124 is sandwiched between the strut 122 and the spherical seat 126 in a compressed state. Thereby, the spherical seat 126 and the rotation ball 128 are pressed downwardly from an upper end of the strut 122.

The aforementioned biasing portions 120 is provided at a plurality of positions on the moving stage 130 and cooperatively biases the moving stage 130 downwardly, in other words, in a direction approaching the base 110. As the moving stage 130 is supported by the vibration actuator unit 201 from a downward side, a contact portion 210 provided at the upper end of the vibration actuator unit 201 is pressed against a lower surface of the moving stage 130.

Note that a structure of the biasing portions 120 is not limited to the example illustrated in the figure. As the biasing portions 120 is provided in order to maintain the contact portion 210 of the vibration actuator unit 201 and an actuated surface of the moving stage 130, which is an actuating subject, to contact each other, the biasing portions 120 may be provided which generates a biasing force by other means such as a magnetic force, a gravity and a pressure of a working fluid.

Figure 2:
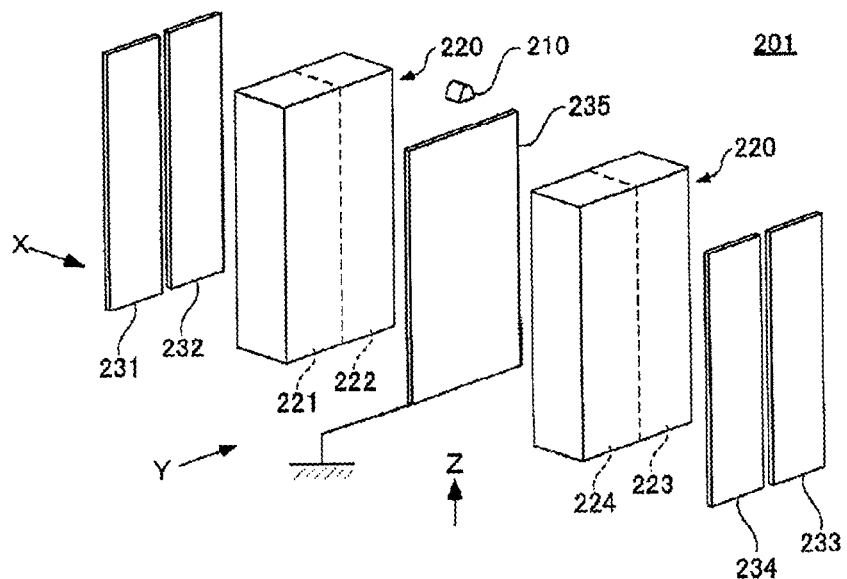
FIG. 2 is a schematic exploded perspective view of the vibration actuator unit 201.

FIG. 2 is a schematic exploded perspective view of the vibration actuator unit 201. The vibration actuator unit 201 has the contact portion 210, a piezoelectric element 220, a common electrode 235 and a plurality of individual electrodes 231, 232, 233, 234.

The contact portion 210 is fixed to an upper surface of the piezoelectric element 220 in the figure, and protrudes from an outer surface of the piezoelectric element 220 to contact the lower surface of the moving stage 130 in the figure. When the piezoelectric element 220 generates a mechanical vibration, the contact portion 210 is vibrated with the piezoelectric element 220.

The piezoelectric element 220 is formed from a piezoelectric material such as PZT. The piezoelectric material extends and contracts in a preliminarily polarized direction when a voltage is applied. In the example illustrated in the figure, a polarization is performed such that a direction indicated by an arrow Z in the figure is a polarization axis direction. Accordingly, when an actuating voltage is applied of which a voltage value periodically changes, the piezoelectric element 220 generates a mechanical vibration to extend and contract in the direction indicated by the arrow Z in the figure.

The individual electrodes 231, 232, 233, 234 and the common electrode are formed from a conductive material such as a metal, and are mutually insulated. The common electrode 235 has approximately the same area as an adjacent piezoelectric element 220, and is coupled to a reference potential, for example, to a ground potential. In other words, the piezoelectric element 220 is, as a whole, divided by the common electrode 235 into two blocks.

The individual electrodes 231, 232, 233, 234 are respectively provided at positions opposing the common electrode 235 across the piezoelectric element 220. Thereby, in the piezoelectric element 220, a plurality of piezoelectric material blocks 221, 222, 223, 224 are formed which are sandwiched between any one of the individual electrodes 231, 232, 233, 234 and the common electrode 235. In other words, the individual electrodes 231, 232, 233, 234 are provided along an arrangement direction of the piezoelectric material blocks 221, 222, 223, 224.

Accordingly, for example, when a voltage is applied to one individual electrode 231, an electric field strongly acts on the piezoelectric material block 221 corresponding to the individual electrode 231, such that the piezoelectric material block 221 extends or contracts. Likewise, when a voltage is applied to any one of the other individual electrodes 232, 233, 234, the corresponding piezoelectric material blocks 222, 223, 224 extend or contract. In this manner, with the piezoelectric element 220 and the individual electrodes 231, 232, 233, 234, an electromechanical converting element is formed which converts an electric vibration of an applied actuating voltage into a mechanical vibration.

Note that, in the vibration actuator unit 201 in use, the contact portion 210, the piezoelectric element 220, the individual electrodes 231, 232, 233, 234 and the common electrode 235 in the figure are in a tight contact mutually. Such vibration actuator unit 201 is not necessarily produced of a combination of assemblies having the shape illustrated in the figure. For example, by layering piezoelectric materials and conductivity materials each of which has a layered shape one after another, the same structure as the vibration actuator unit 201 in the figure can be formed.

Furthermore, in the example illustrated in the figure, the individual electrodes 231, 232, 233, 234 and the common electrode 235 are provided respectively on planes parallel to an arrow Y in the figure. However, each electrode can be provided at the other planes or corner portions of the piezoelectric element 220. Furthermore, if the piezoelectric element 220 is formed in a tubular shape, the electrodes can also be provided on its inner surface.

Figure 3:
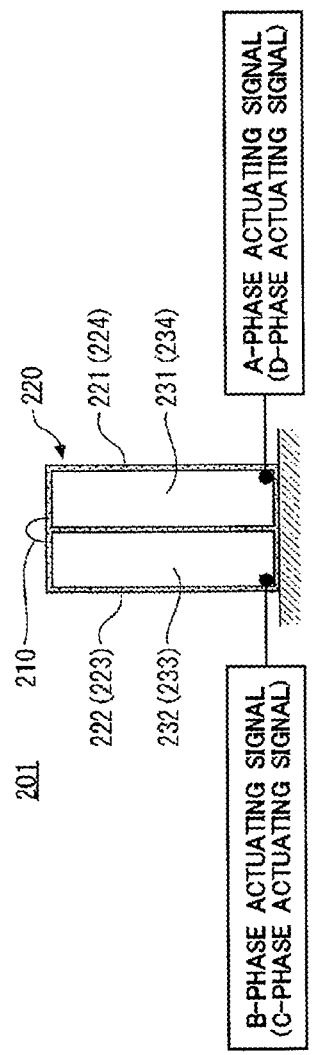
FIG. 3 is a schematic side view of vibration actuator unit 201.

FIG. 3 is a schematic side view of the vibration actuator unit 201. FIG. 3 shows the vibration actuator unit 201 seen from the direction indicated by the arrow X in FIG. 1 and FIG. 2, i.e., a direction normal to a portion of the individual electrodes 231, 232. The same reference numerals are applied to elements in common with FIG. 2 and overlapping descriptions are omitted.

The individual electrodes 231, 232 are provided on right and left areas of the piezoelectric element 220 in the figure, respectively. Here, it is assumed that a B-phase actuating signal applied to the individual electrode 232 positioned on the left side in the figure, and a C-phase actuating signal applied to the individual electrode 233 positioned on a back side of the individual electrode 232 relative to the piezoelectric element 220, periodically change a voltage at the same phase. Furthermore, it is assumed that an A-phase actuating signal applied to the individual electrode 231 positioned on the right side in the figure, and a D-phase actuating signal applied to the individual electrode 234 positioned on a back side of the individual electrode 231 relative to the piezoelectric element 220, periodically change a voltage at the same phase.

Figure 4:
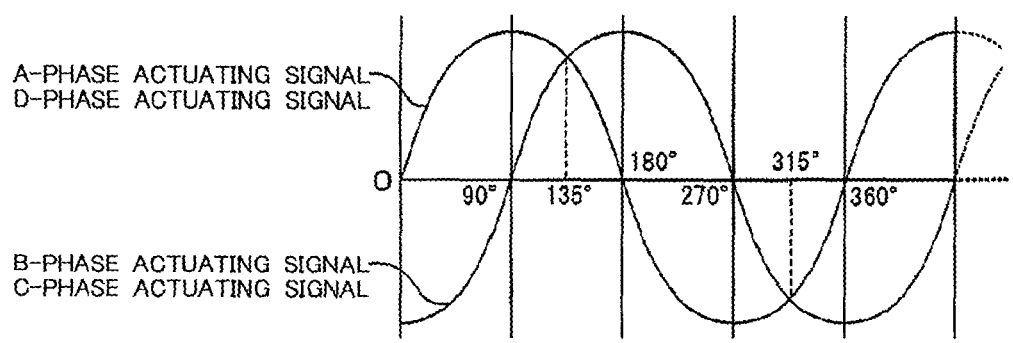
FIG. 4 is a diagram illustrating wave patterns of actuating signals of the vibration actuator unit 201.

FIG. 4 is a diagram illustrating an example of wave patterns of actuating signals supplied to the vibration actuator unit 201. As illustrated in the figure, the A-phase actuating signal and the D-phase actuating signal mutually synchronize. The B-phase actuating signal and the C-phase actuating signal also mutually synchronize. Furthermore, the A-phase actuating signal and the D-phase actuating signal have a phase 90-degree precedent to the B-phase actuating signal and the C-phase actuating signal.

Figure 5:
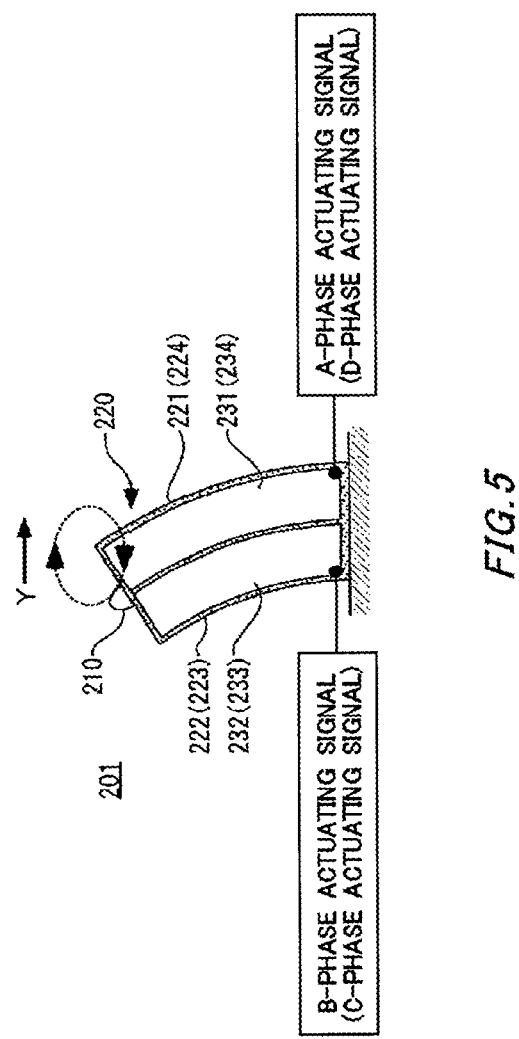
FIG. 5 is a schematic side view of the vibration actuator unit 201.

FIG. 5 is a schematic view explaining an actuation of the vibration actuator unit 201 when the aforementioned combination of the actuating signals is applied to the vibration actuator unit 201. The same reference numerals are applied to elements in common with FIG. 3 and overlapping descriptions are omitted.

In FIG. 4, in the period when the phase of the A-phase actuating signal is 0 to 135 degrees and in the period of 315 degrees or more, voltages of the A-phase actuating signal and the D-phase actuating signal are higher than voltages of the B-phase actuating signal and the C-phase actuating signal. In such cases, as shown in FIG. 5, the piezoelectric material blocks 221, 224 are relatively longer than the piezoelectric material blocks 222, 223, and the piezoelectric element 220 bends such that the contact portion 210 at the upper end is displaced rightward in the figure.

Furthermore, in the period when the phase of the A-phase actuating signal is 135 to 315 degrees, the voltages of the B-phase actuating signal and the C-phase actuating signal are higher than the voltages of the A-phase actuating signal and the D-phase actuating signal. In such cases, the piezoelectric material blocks 222, 223 are relatively longer than the piezoelectric material blocks 221, 224, and the piezoelectric element 220 bends such that the contact portion 210 at the upper end is displaced leftward in the figure.

Moreover, in FIG. 4, in the period when the phase of the A-phase actuating signal is 90 to 180 degrees, voltage values of all actuating signals are positive. Furthermore, in the period when the phase of the A-phase actuating signal is 270 to 360 degrees, voltage values of all actuating signals are negative. Accordingly, the entire length of the piezoelectric element 220 is relatively larger in the former period than the latter period.

To sum up these motions of the piezoelectric element 220, when the actuating signals shown in FIG. 4 are supplied to the vibration actuator unit 201, the contact portion 210 performs an elliptic motion within a plane parallel to the arrow Y in the figure. Accordingly, in the stage apparatus 101, the moving stage 130 which contacts the contact portion 210 performing the elliptic motion moves in the direction of the arrow Y in FIG. 1. Note that if a mutual delay relation of the actuating signals of two phases shown in FIG. 4 is reversed, the moving direction of the moving stage 130 is reversed.

Figure 6:
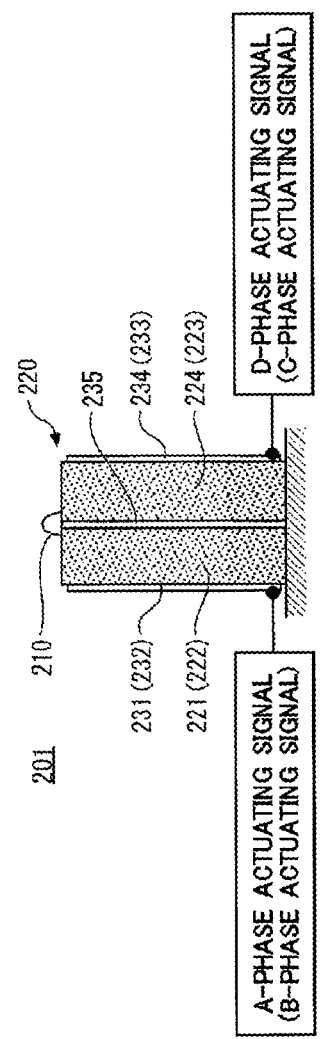
FIG. 6 is a schematic view showing a structure of the vibration actuator unit 201.

FIG. 6 is a schematic side view of the vibration actuator unit 201. FIG. 6 shows the vibration actuator unit 201 seen from the direction indicated by the arrow Y in FIG. 1 and FIG. 2, i.e., a plane direction of the individual electrodes 231, 234 and the common electrode 235. The same reference numerals are applied to elements in common with FIG. 2 and overlapping descriptions are omitted.

Between each of the individual electrodes 231, 234 and the common electrode 235, the piezoelectric element 220 is positioned. Here, it is assumed that an A-phase actuating signal applied to the individual electrode 231 positioned in the left side in the figure, and a B-phase actuating signal applied to the individual electrode 232 adjacent to the individual electrode 231 periodically change a voltage the same phase. Furthermore, it is assumed that a D-phase actuating signal applied to the individual electrode 234 positioned in the right side in the figure, and a C-phase actuating signal applied to the individual electrode 233 adjacent to the individual electrode 234 periodically change a voltage the same phase.

Figure 7:
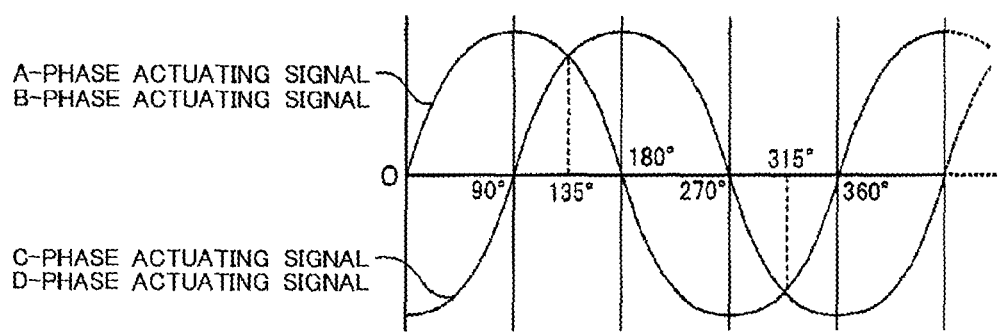
FIG. 7 is a diagram illustrating wave patterns of actuating signals of the vibration actuator unit 201.

FIG. 7 is a diagram illustrating an example of wave patterns of actuating signals supplied to the vibration actuator unit 201. As illustrated in the figure, the A-phase actuating signal and the B-phase actuating signal mutually synchronize. The D-phase actuating signal and the C-phase actuating signal also mutually synchronize. Furthermore, the A-phase actuating signal and the B-phase actuating signal have a phase 90-degree precedent to the D-phase actuating signal and the C-phase actuating signal.

Figure 8:
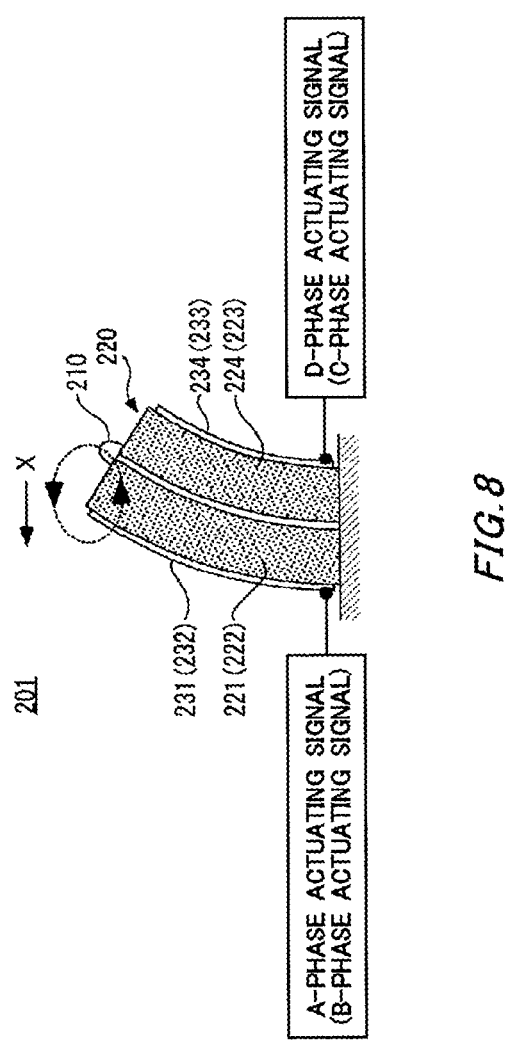
FIG. 8 is a schematic side view of the vibration actuator unit 201.

FIG. 8 is a schematic view explaining motions of the vibration actuator unit 201 when the aforementioned combination of the actuating signals is applied to the vibration actuator unit 201. The same reference numerals are applied to elements in common with FIG. 6 and overlapping descriptions are omitted.

In FIG. 8, in a period when the phase of the A-phase actuating signal is 0 to 135 degrees and in a period 315 degrees or more, voltages of the A-phase actuating signal and the B-phase actuating signal are higher than voltages of the D-phase actuating signal and the C-phase actuating signal. In such cases, as shown in FIG. 8, the piezoelectric material blocks 221, 222 are relatively longer than the piezoelectric material blocks 224, 223, and the piezoelectric element 220 bends such that the contact portion 210 at the upper end is displaced leftward in the figure.

Furthermore, in a period when the phase of the A-phase actuating signal is 135 to 315 degrees, the voltages of the D-phase actuating signal and C-phase actuating signal are higher than the voltages of the A-phase actuating signal and B-phase actuating signal. In such cases, the piezoelectric material blocks 221, 222 are relatively longer than piezoelectric material blocks 224, 223, and the piezoelectric element 220 bends such that the contact portion 210 at the upper end is displaced rightward in the figure.

Moreover, in FIG. 7, in a period when the phase of the A-phase actuating signal is 90 to 180 degrees, the voltage values of all actuating signal are positive. Furthermore, in a period when the phase of the A-phase actuating signal is 270 to 360 degrees, the voltage values of all actuating signal are negative. Accordingly, the entire length of the piezoelectric element 220 is relatively larger in the former period than the latter period.

To sum up these motions of the piezoelectric element 220, when the actuating signal shown in FIG. 7 is supplied to the vibration actuator unit 201, the contact portion 210 performs an elliptic motion within a plane parallel to the arrow X in the figure. Accordingly, in the stage apparatus 101, the moving stage 130 which contacts the contact portion 210 performing an elliptic motion moves in the direction of the arrow X in FIG. 1. Furthermore, if a mutual delay relation of the actuating signals of two phases shown in FIG. 7 is reversed, the moving direction of the moving stage 130 is reversed.

As described above with reference to FIG. 3 to FIG. 8, the vibration actuator unit 201 allows the moving stage 130 to move both in the direction of the arrow X and in the direction of the arrow Y. Moreover, by applying an actuating signal which is a superposition of the actuating signals shown in FIG. 4 and the actuating signals shown in FIG. 7, to the vibration actuator unit 201, the moving stage 130 can also move in a direction that the direction of the arrow X and the direction of the arrow Y are combined.

In this manner, even though the vibration actuator unit 201 is a single actuator, it can move the moving stage 130 two-dimensionally by changing the combination of the actuating signals. Note that, even though FIG. 1 depicts a single vibration actuator unit 201, it is obvious that a plurality of vibration actuator units 201 may be provided.

Figure 9:
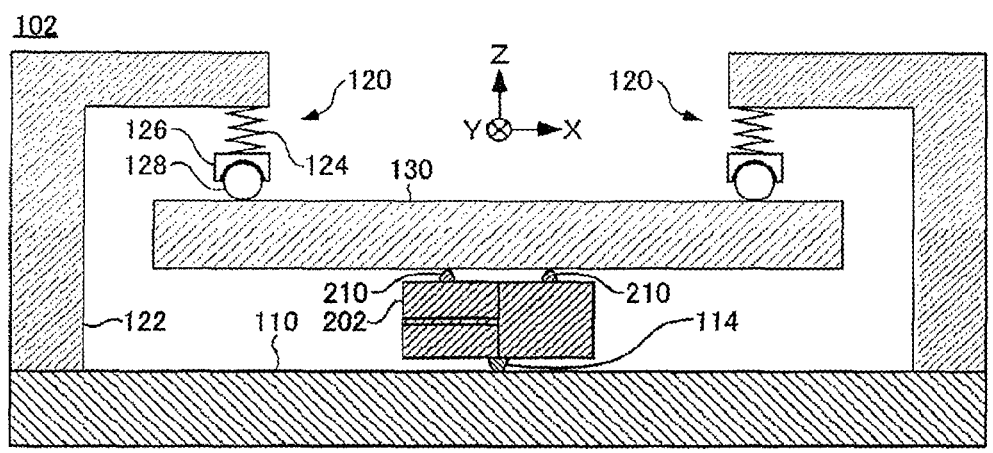
FIG. 9 is a schematic cross sectional view of a stage apparatus 102.

FIG. 9 is a schematic cross sectional view of a stage apparatus 102. The stage apparatus 102 has, except for a portion which will be described later, the same structure as the stage apparatus 101 shown in FIG. 1. Thus, the same reference numeral as the stage apparatus 101 is applied to the common element, and overlapping descriptions are omitted.

The stage apparatus 102 differs from the stage apparatus 101 in that it comprises a vibration actuator unit 202. The vibration actuator unit 202 has a single support portion 114 on a lower surface in the figure, which protrudes downwardly. The support portion 114 contacts the upper surface of the base 110, and supports and fixes the vibration actuator unit 202 at one point.

Furthermore, the vibration actuator unit 202 has a pair of contact portions 210 on the upper surface in the figure. The moving stage 130 is biased downwardly by the biasing portions 120, which is same as the vibration actuator unit 201. Thereby, the pair of contact portions 210 respectively contacts the lower surface of the moving stage 130, and supports the moving stage 130 from a downward side.

Figure 10:
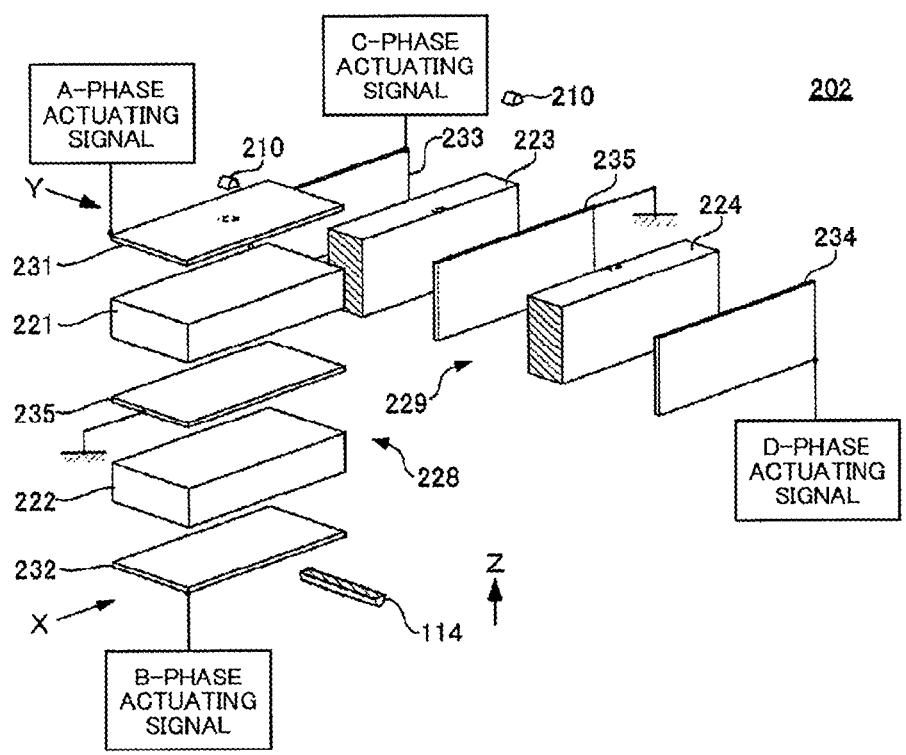
FIG. 10 is a schematic exploded perspective view of the vibration actuator unit 202.

FIG. 10 is a schematic exploded perspective view of the vibration actuator unit 202. The vibration actuator unit 202 has a pair of contact portions 210, a piezoelectric element divided into the plurality of piezoelectric material blocks 221, 222, 223, 224, the common electrode 235 and the plurality of individual electrodes 231, 232, 233, 234, respectively. In the vibration actuator unit 202, each of the piezoelectric material blocks 221, 222, 223, 224 polarizes in a longitudinal direction, i.e., in a state shown in FIG. 9, in the direction indicated by the arrow X in the figure.

In the vibration actuator unit 202, a left-wing block 228 corresponding to a left half in the figure is separated by the individual electrodes 231, 232 and the common electrode 235 provided horizontally in the figure, to configure the pair of piezoelectric material blocks 221, 222 arranged vertically in the figure. In other words, the individual electrodes 231, 232 are arranged in an arrangement direction of the piezoelectric material blocks 221, 222.

Furthermore, in the vibration actuator unit 202, a right-wing block 229 corresponding to a right half in the figure is separated by the individual electrodes 233, 234 and the common electrode 235 provided vertically in the figure, to configure the pair of piezoelectric material blocks 223, 224 arranged horizontally in the figure arrangement. In other words, the individual electrodes 233, 234 are arranged in an arrangement direction of the piezoelectric material blocks 223, 224.

Accordingly, for example, when a voltage is applied to one individual electrode 231, an electric field strongly acts on the piezoelectric material block 221 corresponding to the individual electrode 231 such that the piezoelectric material block 221 extends or contracts. Likewise, when a voltage is applied to any of the other individual electrodes 232, 233, 234, the corresponding piezoelectric material blocks 222, 223, 224 extend or contract.

Thereby, when actuating voltages different from each other are applied to the individual electrodes 231, 232, the left-wing block 228 of the vibration actuator unit 202 generates a mechanical vibration in the stage apparatus 102, to bend within a plane normal to the outer surface of the base 110. Furthermore, when actuating voltages different from each other are applied to the individual electrodes 233, 234, the right-wing block 229 of the vibration actuator unit 202 generates a mechanical vibration in the stage apparatus 102, to bend within a plane parallel to the outer surface of the base 110.

One of the pair of contact portions 210 is provided, in the individual electrode 231 positioned on the upper surface of the left-wing block 228, at a center in a plane direction. The other contact portion 210 is provided approximately at a center of an upper surface formed when the individual electrodes 233, 234, the piezoelectric material blocks 223, 224 and the common electrode 235 of the right-wing block 229 are in a tight contact with one another. These contact portions 210 are respectively vibrated together, when any one of the piezoelectric material blocks 221, 222 and the piezoelectric material blocks 223, 224 is vibrated.

Note that, in the vibration actuator unit 202 in use, the contact portions 210, the piezoelectric material blocks 221, 222, 223, 224, the individual electrodes 231, 232, 233, 234 and the common electrode 235 in the figure are in a tight contact mutually. Such vibration actuator unit 202 is not necessarily produced of a combination of assemblies having a shape in the figure. For example, by layering piezoelectric materials and conductivity materials each of which has a layered shape one after another, the same structure as the vibration actuator unit 201 in the figure can be formed.

Furthermore, when the aforementioned vibration actuator unit 202 is produced, after the piezoelectric material blocks 221, 222, 223, 224, the individual electrodes 231, 232, 233, 234 and the common electrode 235 are assembled, the support portion 114 and the contact portion 210 may be adhesively attached. As a material of the support portion 114 and the contact portion 210, for example, less deformable and anti-wearing POTICON (trade name) can be used.

Figure 11:
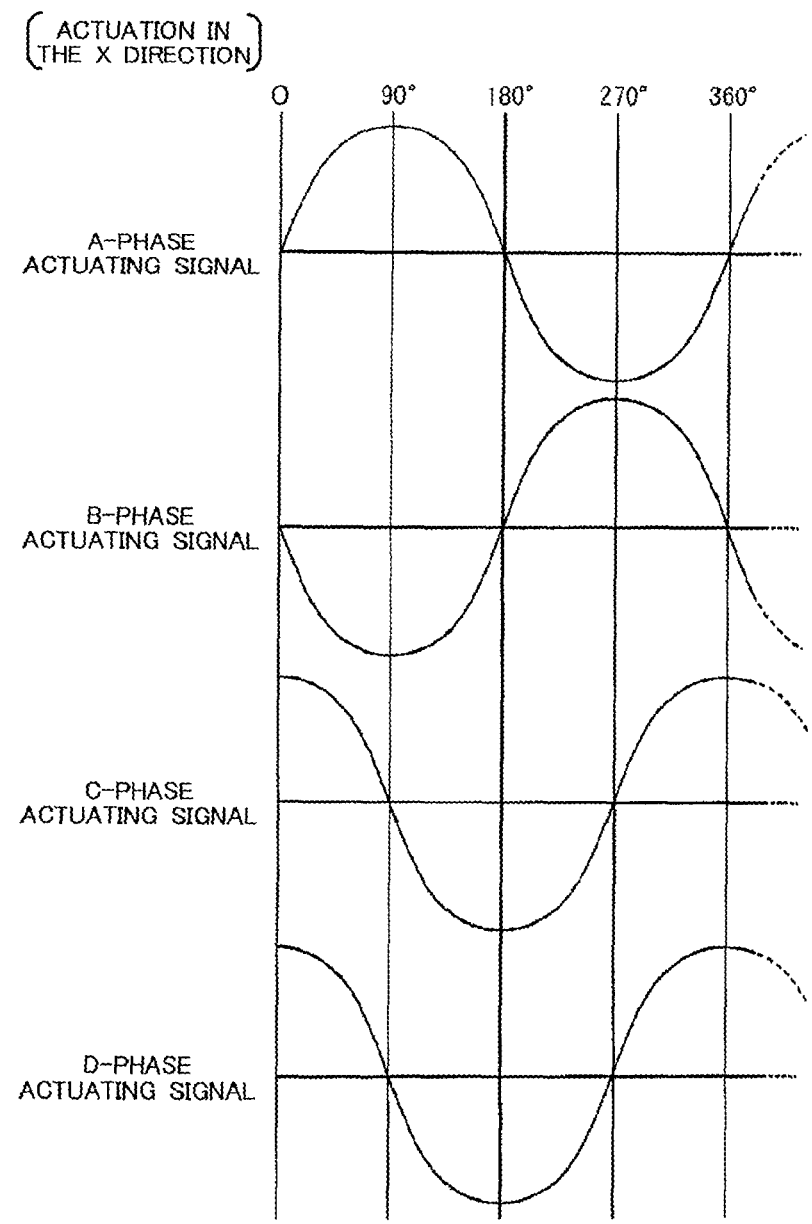
FIG. 11 is a diagram illustrating wave patterns of actuating signals of the vibration actuator unit 202.

FIG. 11 is a diagram illustrating wave patterns of actuating signals applied to the individual electrodes 231, 232, 233, 234 of the vibration actuator unit 202. Note that, as shown in FIG. 10, the A-phase actuating signal is applied to the individual electrode 231, the B-phase actuating signal is applied to the individual electrode 232, the C-phase actuating signal is applied to the individual electrode 233 and the D-phase actuating signal is applied to the individual electrode 234, respectively.

In the example illustrated in the figure, the A-phase actuating signal and the B-phase actuating signal have phases which differ by 180 degrees to each other, and the signal wave patterns which are mutually reversed. When such A-phase actuating signal and B-phase actuating signal are applied, the piezoelectric material blocks 221, 222 in the vibration actuator unit 202 generate, as mentioned above, a mechanical vibration to bend within a plane normal to the upper surface of the base 110 of the stage apparatus 102.

Meanwhile, the C-phase actuating signal and the D-phase actuating signal synchronize and have mutually the same signal wave pattern. When such C-phase actuating signal and D-phase actuating signal are applied, the piezoelectric material blocks 223, 224 in the vibration actuator unit 202 integrally extend and contract. In this case, the extending and contracting direction of the piezoelectric material blocks 223, 224 is the direction indicated by the arrow X in FIG. 9 and FIG. 10.

Moreover, in the wave patterns of actuating signals shown in FIG. 11, the phases of the A-phase actuating signal and the B-phase actuating signal are delayed by 90 degrees relative to the wave pattern of the C-phase actuating signal and the phase of the D-phase actuating signal. Accordingly, by combining a bending vibration of the piezoelectric material blocks 221, 222 within a vertical plane, and an extension and contraction of the piezoelectric material blocks 221, 222 in the longitudinal direction, the vibration actuator unit 202 can move, in the stage apparatus 102, the moving stage 130 in the direction indicated by the arrow X in the figure. Note that, when a mutual delay relation of, shown in FIG. 11, the A-phase actuating signal and the B-phase actuating signal, and the C-phase actuating signal and the D-phase actuating signal is reversed, the moving direction of the moving stage 130 is reversed.

Figure 12:
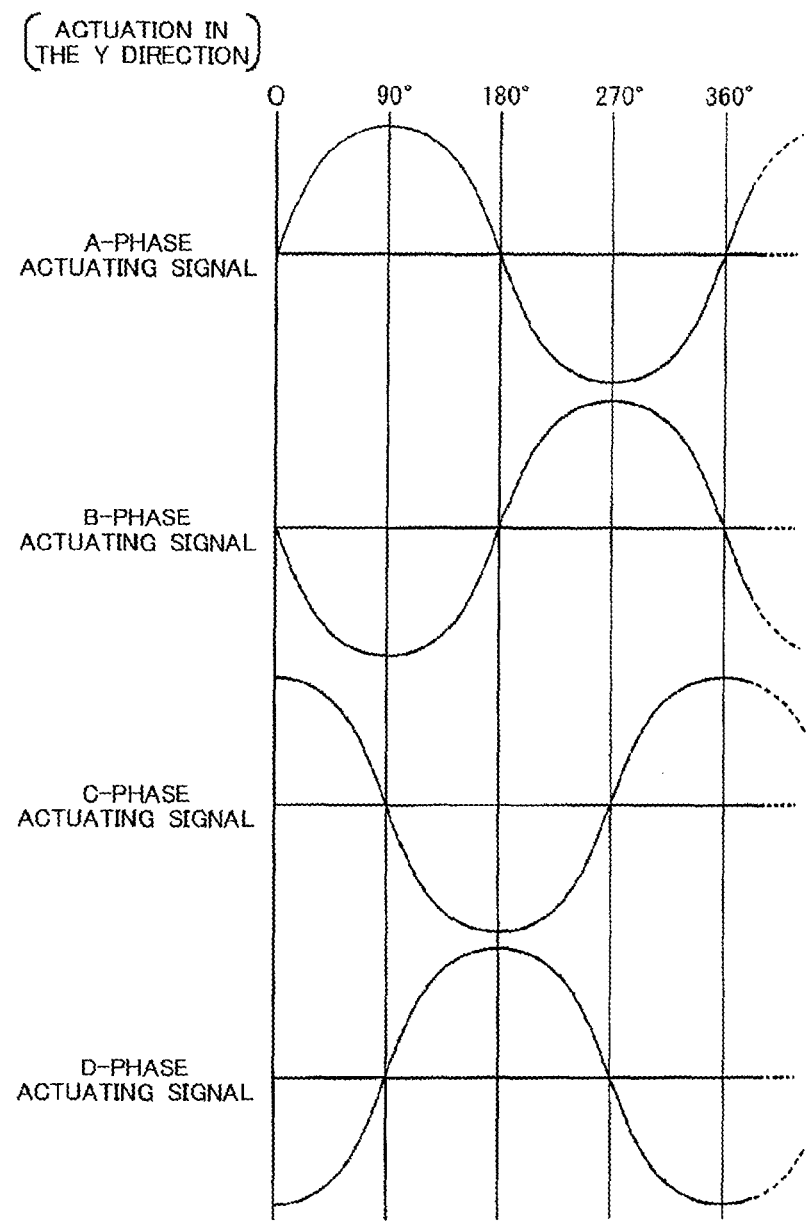
FIG. 12 is a diagram illustrating wave patterns of actuating signals of the vibration actuator unit 202.

FIG. 12 is a diagram illustrating other wave patterns of actuating signals applied to the individual electrodes 231, 232, 233, 234 of the vibration actuator unit 202. In the example illustrated in the figure, the A-phase actuating signal and the B-phase actuating signal have phases which differ by 180 degrees from each other, and signal wave patterns which are mutually reversed. Accordingly, the piezoelectric material blocks 221, 222 generate a mechanical vibration, as mentioned above, to bend within a plane normal to the upper surface of the base 110 of the stage apparatus 102.

Furthermore, in the wave patterns of actuating signals shown in FIG. 12, the C-phase actuating signal and the D-phase actuating signal also have phases which differ by 180 degrees from each other, and signal wave patterns which are mutually reversed. Accordingly, the piezoelectric material blocks 223, 224 generate a mechanical vibration to bend within a plane parallel to the outer surface of the base 110 of the stage apparatus 102.

Moreover, in the wave patterns of actuating signals shown in FIG. 12, the phases of the A-phase actuating signal and the B-phase actuating signal are delayed by 90 degrees relative to the wave pattern of the C-phase actuating signal and the phase of the D-phase actuating signal. Accordingly, by combining a bending vibration of the piezoelectric material blocks 221, 222 within a vertical plane and a bending motion of the piezoelectric material blocks 223, 224 within a horizontal plane, the vibration actuator unit 202 moves, in the stage apparatus 102, the moving stage 130 in a direction opposite to the direction indicated by the arrow Y in the figure. Note that, when a mutual delay relation shown in FIG. 11 of the A-phase actuating signal and the B-phase actuating signal, and the C-phase actuating signal and the D-phase actuating signal is reversed, the moving direction of the moving stage 130 is reversed.

As described with reference to FIG. 9 to FIG. 12, the vibration actuator unit 202 can move the moving stage 130 both in the direction of the arrow X and in the direction of the arrow Y. Moreover, variable changes in the mutual delay relations of the A-phase to D-phase actuating signals can change the moving directions of the moving stage 130.

In this manner, even though the vibration actuator unit 202 is a single actuator, it can move the moving stage 130 two-dimensionally by changing the combination of the actuating signals. Even though the stage apparatus 102 in FIG. 9 is provided with the single vibration actuator unit 201, depending on an expected load, it is obvious that a plurality of vibration actuator units 202 may be provided.

Figure 13:
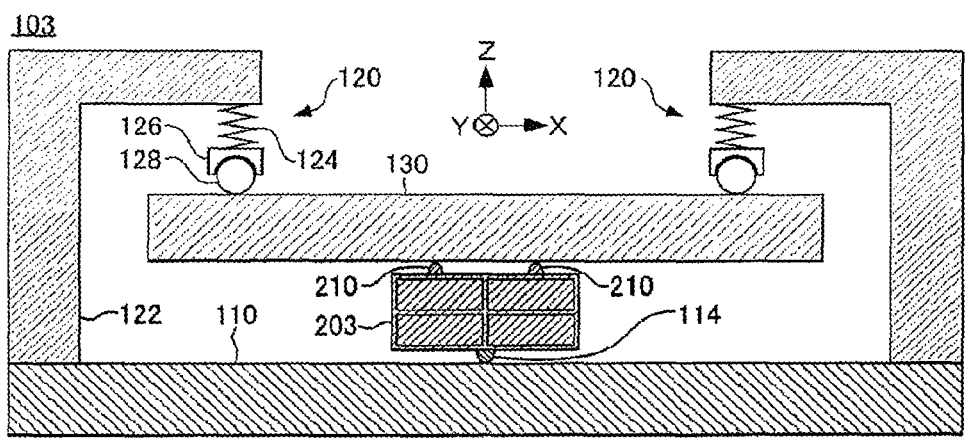
FIG. 13 is a schematic cross sectional view of a stage apparatus 103.

FIG. 13 is a schematic cross sectional view of a stage apparatus 103. The stage apparatus 103 has, except for a portion which will be described later, the same structure as the stage apparatus 102 shown in FIG. 9. Thus, the same reference numeral as the stage apparatus 102 is applied to the common element, and overlapping descriptions are omitted.

The stage apparatus 102 differs from the stage apparatus 102 in that it comprises a vibration actuator unit 203. The vibration actuator unit 203 differs from the vibration actuator unit 202 in positions of the piezoelectric material blocks 221, 222, 223, 224 formed by the individual electrodes 231, 232, 233, 234 and the common electrode 235.

Figure 14:
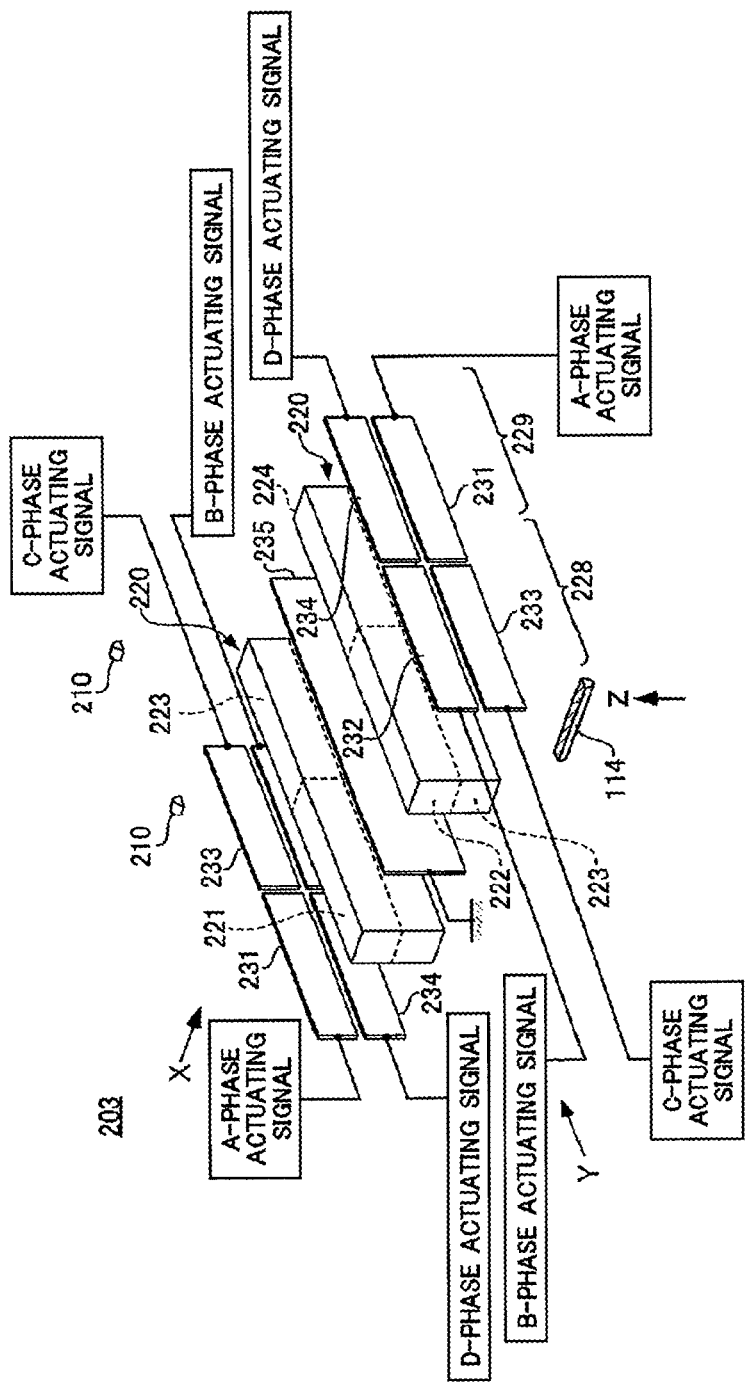
FIG. 14 is a schematic exploded perspective view of the vibration actuator unit 203.

FIG. 14 is a schematic exploded perspective view of the vibration actuator unit 203. The vibration actuator unit 203 has the pair of contact portions 210, the piezoelectric element 220 divided into the plurality of piezoelectric material blocks, the common electrode 235 and the plurality of individual electrodes 231, 232, 233, 234, respectively. In the vibration actuator unit 203, each of the piezoelectric material blocks 221, 222, 223, 224 polarizes in a longitudinal direction, i.e., in a state shown in FIG. 13, in the direction indicated by the arrow X in the figure.

In the vibration actuator unit 203, the piezoelectric element 220 is separated, by the common electrode 235 provided in the longitudinal direction, into a pair of piezoelectric elements 220 aligned in a direction normal to the longitudinal direction. Moreover, in each of the pair of piezoelectric elements 220, on a plane opposing the common electrode 235, the four individual electrodes 231, 232, 233, 234 are provided which divide the plane in quarters longitudinally and laterally.

Thereby, in the piezoelectric element 220 as a whole, the eight piezoelectric material blocks 221, 222, 223, 224 are formed to correspond to the eight individual electrodes 231, 232, 233, 234. Each of the eight piezoelectric material blocks 221, 222, 223, 224 includes one of apexes of the piezoelectric element 220 which configures a hexahedron as a whole.

Furthermore, of the eight individual electrodes 231, 232, 233, 234, a pair having the same reference numeral is provided at diagonally opposing corners of the piezoelectric element 220 which configures a hexahedron as a whole, and receives the actuating signal of the same phase in common In the aforementioned vibration actuator unit 203, the left-wing block 228 corresponding to a left half in the figure and the right-wing block 229 corresponding to a right half in the figure actuates in a similar manner with the vibration actuator unit 201 shown in FIG. 2, respectively. However, as these blocks are coupled in a rotating state around a common rotational axis in the longitudinal direction of the piezoelectric element 220, the left half and the right half of the piezoelectric element 220 in the figure differ in their actuations.

Thereby, in the vibration actuator unit 203, when the actuating signal is supplied, an amplitude of a vibration generated in the piezoelectric element 220 is larger. Accordingly, in the stage apparatus 103, the moving stage 130 is effectively actuated.

Figure 15:
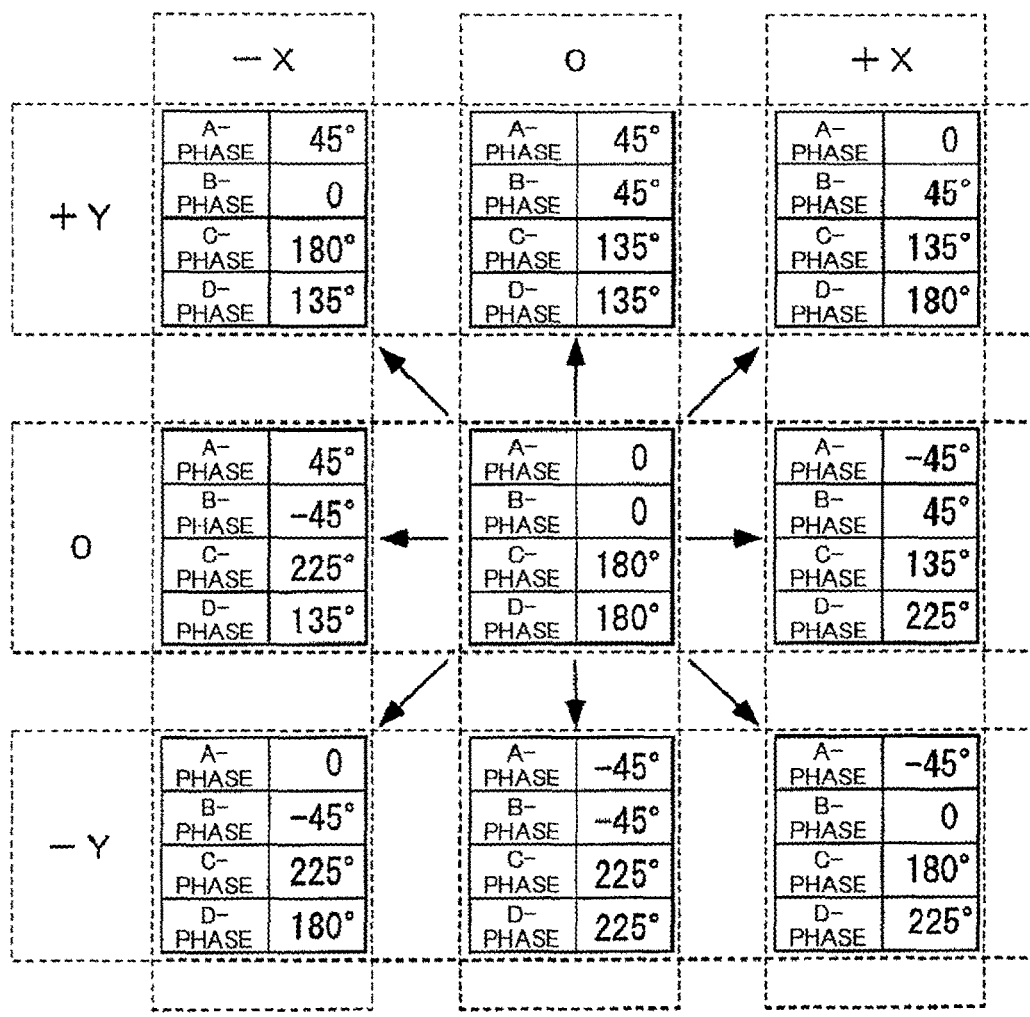
FIG. 15 is a diagram illustrating a phase relation of the actuating signals.

FIG. 15 is a diagram illustrating a phase relation of the actuating signals applied to the individual electrodes 231, 232, 233, 234 of the vibration actuator unit 203. Furthermore, in FIG. 15, signs of X and Y described in the upper row and the left column correspond to the arrow X and the arrow Y shown in FIG. 13, and indicate the moving directions of the moving stage 130 actuated by the vibration actuator unit 203. As illustrated in the figure, by variously changing mutual delay relations of the A-phase to D-phase actuating signals, the moving direction of the moving stage 130 can be changed.

As described with reference to FIG. 13 to FIG. 15, the vibration actuator unit 203 actuates the eight piezoelectric material blocks 221, 222, 223, 224 with the actuating signals of four phases such that the moving stage 130 moves both in the direction of the arrow X and in the direction of the arrow Y. Furthermore, by changing mutual phase delay relations of the actuating signals, the moving direction of the moving stage 130 can be changed.

In this manner, even though the vibration actuator unit 203 is a single actuator, by changing a combination of the actuating signals, it can move the moving stage 130 two-dimensionally. Even though the single vibration actuator unit 203 is provided in the stage apparatus 102 in FIG. 9, depending on an expected load, a plurality of vibration actuator unit 203 may be provided.

Figure 16:
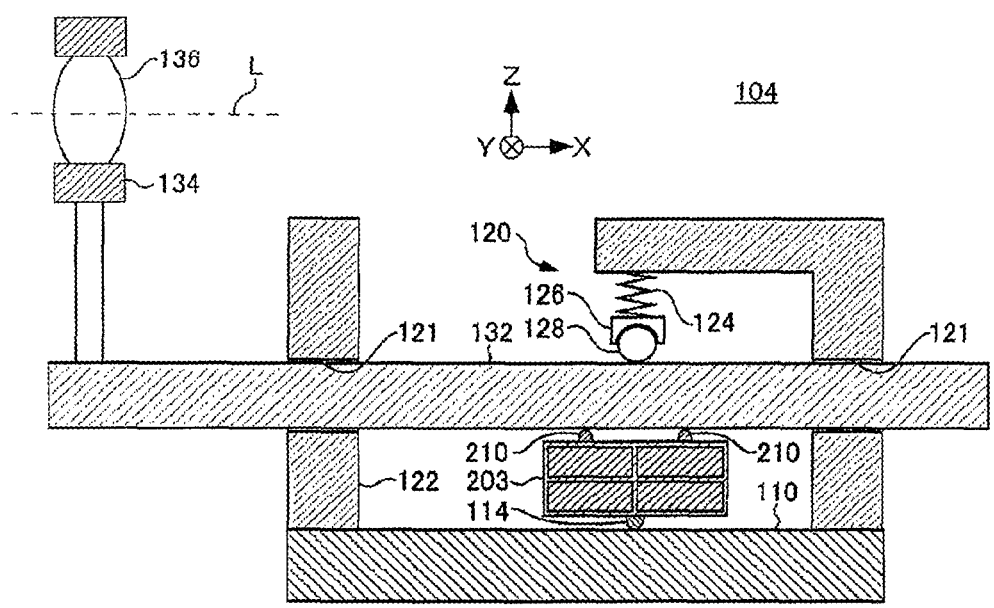
FIG. 16 is a schematic cross sectional view of an optical apparatus 104.

FIG. 16 is a schematic cross sectional view of an optical apparatus 104. The optical apparatus 104 comprises the vibration actuator unit 203. Furthermore, the same reference numeral as the stage apparatus 103 shown in FIG. 13 is applied to the common element, and overlapping descriptions are omitted.

The optical apparatus 104 has a unique structure in that it comprises a moving axis 132, instead of the moving stage 130 in the stage apparatus 102. The moving axis 132 is inserted through a bearing portion 121 provided in the strut 122, and supported by the base 110 slidably in the direction indicated by the arrow X in the figure. Furthermore, the moving axis 132 is supported at the bearing portion 121 rotatably around a central axis of the longitudinal direction.

The moving axis 132 holds, at a holding frame 134 attached thereto outside the base 110 at one outer end, a lens 136 configuring a portion of an optical system. Accordingly, the lens 136 moves, when the moving axis 132 slides in the longitudinal direction, along an optical axis L parallel to the central axis of the moving axis 132.

Figure 17:
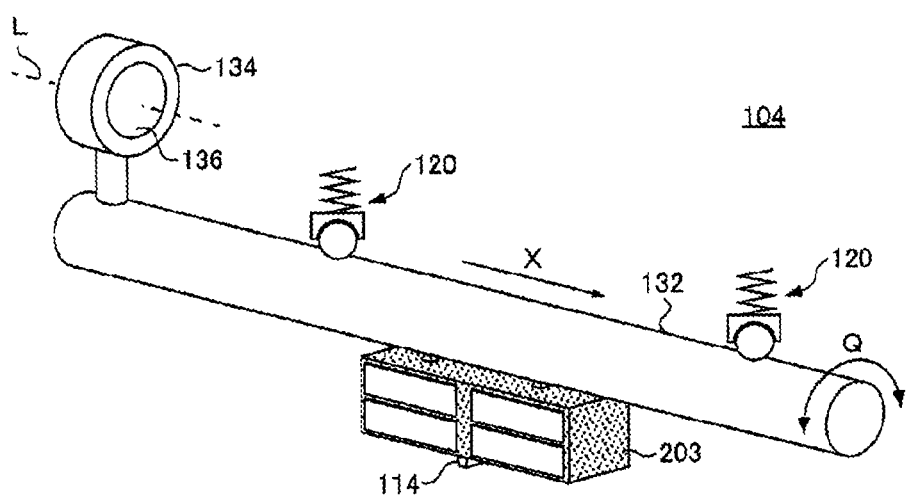
FIG. 17 is a schematic view of the optical apparatus 104.

FIG. 17 is a schematic perspective view of the optical apparatus 104. The same reference numerals are applied to elements in common with FIG. 16 and overlapping descriptions are omitted. Furthermore, in FIG. 17, the base 110 and the strut 122 are omitted.

As illustrated in the figure, in the optical apparatus 104, the contact portions 210 of the vibration actuator unit 203 contact a circumferential surface of the moving axis 132 of a cylindrical shape, and transmit an actuating force. Accordingly, when the vibration actuator unit 203 generates the actuating force in the direction of the arrow X shown in FIG. 16, the moving axis 132 moves in the direction of its central axis.

Furthermore, in the optical apparatus 104, when the vibration actuator unit 203 generates the actuating force in the direction of the arrow Y shown in FIG. 16, the moving axis 132 is rotated, as indicated by an arrow Q in FIG. 17, around its central axis. When the moving axis 132 is rotated, the lens 136 deviates from the optical axis L.

In this manner, by using the vibration actuator unit 203, the lens 136 of an optical member can move not only in the direction of the optical axis L, but also in a direction deviating from the optical axis L. Accordingly, in addition to changing a characteristic of the optical system by moving the lens 136, the optical configuration as such can be changed by removing the lens 136 from the optical system.

Note that, in the aforementioned example, the optical apparatus 104 has been formed by using the vibration actuator unit 203. However, the optical apparatus 104 may be formed by using other vibration actuator units 201, 202 which have been already described.

Figure 18:
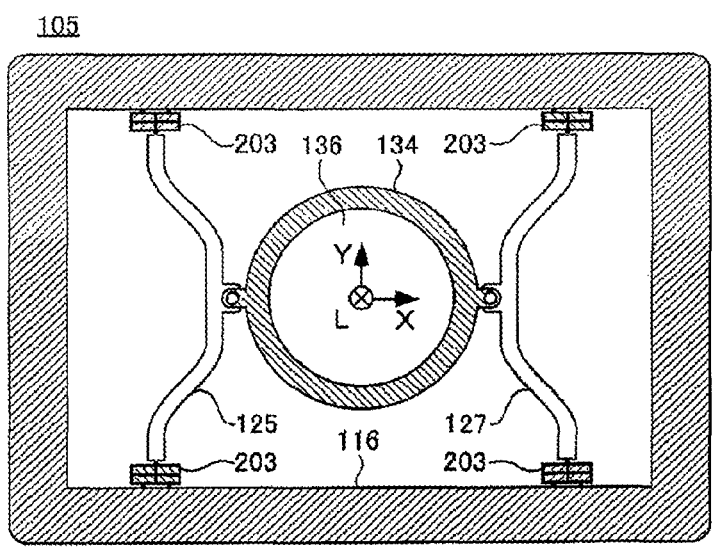
FIG. 18 is a schematic view of an optical apparatus 105.

FIG. 18 is a schematic cross sectional view of an optical apparatus 105 and shows a cross section normal to the optical axis L of the optical system including the lens 136. The same reference numerals are applied to elements in common with FIG. 17 and overlapping descriptions are omitted.

The optical apparatus 105 comprises a lens barrel 116, flat springs 125, 127, the holding frame 134, the lens 136 and the vibration actuator units 203. The holding frame 134 holding the lens 136 is coupled to the pair of flat springs 125, 127. The individual vibration actuator unit 203 has the same structure as the vibration actuator unit 203 which has been already described, and can move in a vertical direction relative to the page, and in a direction parallel to the page, relative to an inner surface of the lens barrel 116.

The pair of flat springs 125, 127 is biased in an extending direction, and the respective end portions press the vibration actuator units 203 against the inner surface of the lens barrel 116. Thereby, the holding frame 134 and the lens 136 are held at approximately a center of the lens barrel 116 in the figure.

In the aforementioned optical apparatus 105, when a portion of the vibration actuator units 203 move in the direction of the optical axis L, an inclination of the lens 136 relative to the optical axis L is changed. Furthermore, when all of the vibration actuator units 203 move in the direction of the optical axis L at the same time, the lens 136 translates in the direction of the optical axis L, while maintaining an angle relative to the optical axis L. Moreover, when all of the vibration actuator units 203 move parallel to the page at the same time, the lens 136 moves parallel to the page, while maintaining the inclination relative to the optical axis L, as indicated by the arrow X in the figure.

Figure 19:
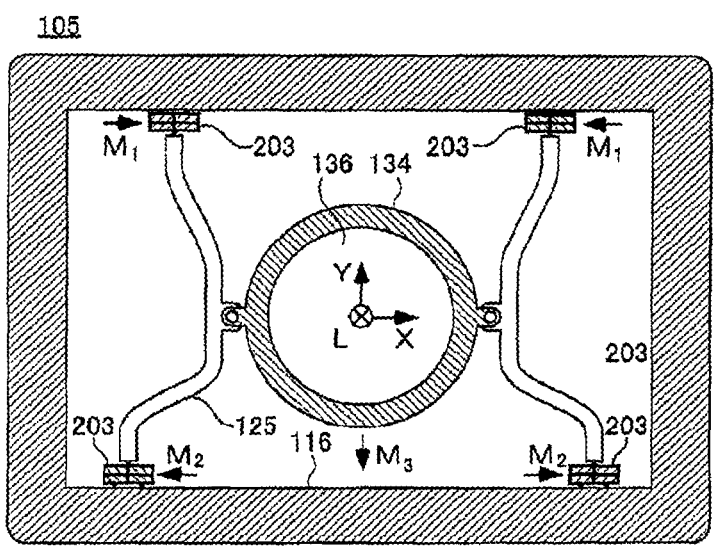
FIG. 19 is a schematic view of an optical apparatus 105.

FIG. 19 is a schematic cross sectional view explaining another operation of the optical apparatus 105 shown in FIG. 18. The same reference numerals are applied to elements in common with FIG. 18 and overlapping descriptions are omitted.

In the optical apparatus 105 shown in FIG. 19, the pair of vibration actuator units 203 provided in an upper side in the figure moves, as indicated by an arrow M1 in the figure, in a mutually approaching direction and parallel to the page. Furthermore, the pair of vibration actuator units 203 provided in a lower side in the figure moves, as indicated by an arrow M2 in the figure, in a mutually departing direction and parallel to the page.

With aforementioned actuations of the vibration actuator units 203, upper portions of the flat springs 125, 127 in the figure approach parallel to a lateral surface of the lens barrel 116. Meanwhile, inclinations of lower portions of the flat springs 125, 127 in the figure are increased, relative to the lateral surface of the lens barrel 116. Thereby, the lens 136 translates, as indicated by an arrow M3 in the figure, toward a lower position within the lens barrel 116.

In this manner, the vibration actuator units 203 in the upper side in the figure and the vibration actuator units 203 in the lower side in the figure mutually actuate differently such that the lens 136 also moves vertically in the figure. Moreover, by combining the actuations of these vibration actuator units 203, an optical adjustment of the lens 136 can be performed with an electrical control over the vibration actuator units 203.

Note that, in the aforementioned example, the optical apparatus 105 has been formed using the vibration actuator units 203. However, the optical apparatus 105 may be formed using the other vibration actuator units 201, 202 which have been already described.

Figure 20:
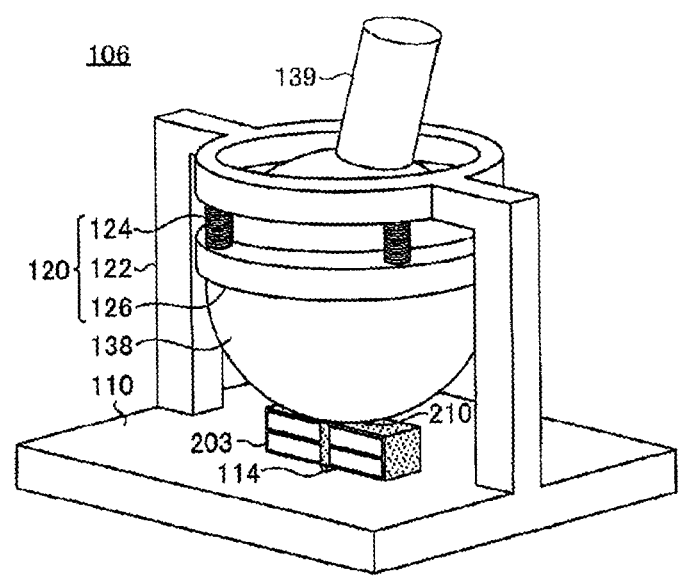
FIG. 20 is a schematic view of an active rotating articulation apparatus 106.

FIG. 20 is schematic perspective view of an active rotating articulation apparatus 106. The active rotating articulation apparatus 106 comprises the base 110, the biasing portions 120, an actuated spherical body 138 and the vibration actuator unit 203.

The vibration actuator unit 203 allows the support portion 114 to contact the upper surface of the base 110, and is fixed to the base 110. The actuated spherical body 138 contacts the contact portion 210 of the vibration actuator unit 203, and is supported and fixed from a downward side in the figure.

The biasing portions 120 comprises the strut 122 extending from base 110 upwardly in the figure, the elastic member 124 hung from the strut 122, and the spherical seat 126 biased downwardly by the elastic member 124. The spherical seat 126 biases the actuated spherical body 138 downwardly. Accordingly, the actuated spherical body 138 is pressed against the contact portion 210 of the vibration actuator unit 203.

In the aforementioned active rotating articulation apparatus 106, when the vibration actuator unit 203 is actuated, the actuated spherical body 138 is rotated while maintaining the position unchanged. Thereby, a movable leg 139 attached to the actuated spherical body 138 changes an inclination relative to the base 110.

As already described, the vibration actuator unit 203 generates an actuating force in an optional direction for a plane direction of the base 110. Accordingly, the active rotating articulation apparatus 106 can change, with an electrical control of an actuating power supplied to the vibration actuator unit 203, the inclination of the movable leg 139.

Note that, in the aforementioned example, the active rotating articulation apparatus 106 has been formed using the vibration actuator unit 203. However, the active rotating articulation apparatus 106 may be formed using the other vibration actuator units 201, 202 which have been already described.

Figure 21:
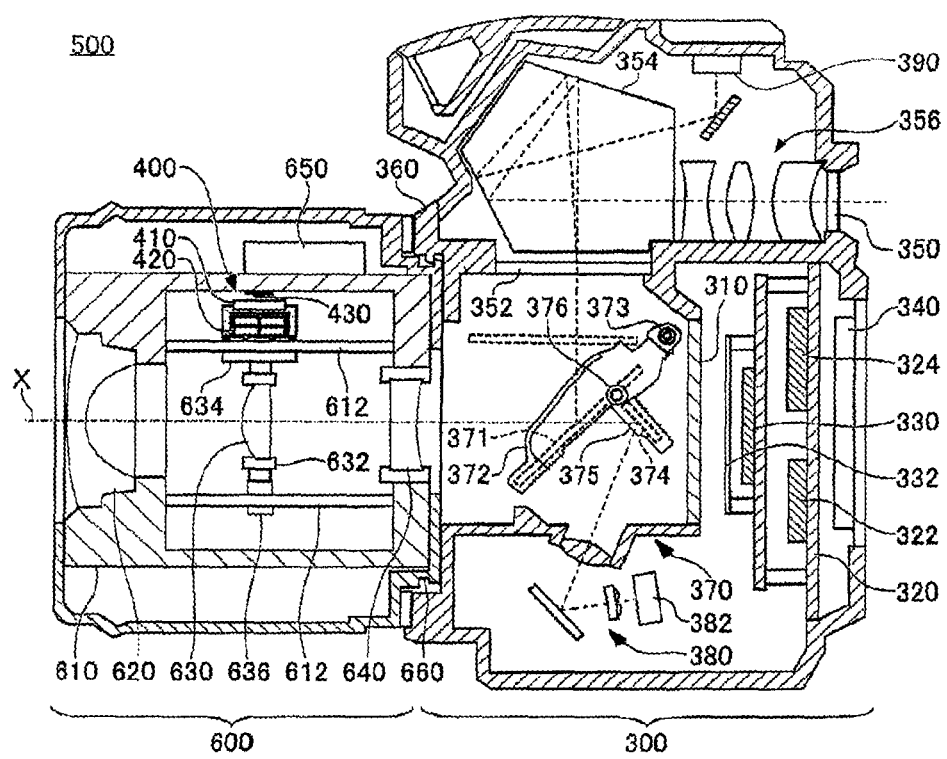
FIG. 21 is a schematic cross sectional view of a camera system 500.

FIG. 21 is a schematic cross sectional view of a camera system 500. The camera system 500 includes a lens unit 600 and a camera body 300.

Note that, in order to simplify the description, in the following description, a side on which a subject to be imaged by the camera system 500 is positioned will be described as a front side or a distal side. Furthermore, in the camera system 500, a side on which the camera body 300 is positioned relative to the lens unit 600 will be described as a rear side or a back side.

The lens unit 600 has a fixed cylinder 610, lens groups 620, 630, 640, a lens-side control portion 650 and a vibration actuator unit 400. At a rear end of the fixed cylinder 610, a lens-side mount portion 660 is provided.

The lens-side mount portion 660 mate with a body-side mount portion 360 of the camera body 300 such that the lens unit 600 is coupled to the camera body 300. As a coupling of the lens-side mount portion 660 and the body-side mount portion 360 can be released, the lens unit 600 can be replaced with another lens unit 600 having a lens-side mount portion 660 of the same standard.

The lens groups 620, 630, 640 are positioned along an optical axis X inside the fixed cylinder 610, and form an optical system. At least one lens group 630 is supported by a holding frame 632 having an interlocking portion 634 and an engaging portion 636.

The interlocking portion 634 interlocks with a guide axis 612. Furthermore, the engaging portion 636 engages with the guide axis 612. The guide axis 612 is provided parallel to the optical axis X of the optical system, and fixed to the fixed cylinder 610. Accordingly, the holding frame 632 is slidably supported along the guide axis 612.

The holding frame 632 is integrally coupled to the vibration actuator unit 400. The vibration actuator unit 400 includes the biasing portion 410 and the electromechanical converting element 420. The biasing portion 410 presses the electromechanical converting element 420 against the guide axis 612. The electromechanical converting element 420 generates a vibration with an actuating power supplied thereto, and generates an actuating force which moves the holding frame 632 along the guide axis 612.

Note that, to an inner surface of the fixed cylinder 610, a magnetic sensor 430 provided opposing the vibration actuator unit 400 is fixed. The magnetic sensor 430 is used to detect positions of the biasing portion 410 and the electromechanical converting element 420.

The lens-side control portion 650 includes an actuating circuit which outputs an actuating power of the vibration actuator unit 400, and performs an overall control over the lens unit 600. Furthermore, the lens-side control portion 650 also performs a communication between a body-side control portion 322 mounted on the camera body 300 and the lens unit 600. Thereby, the lens unit 600 loaded on the camera body 300 operates in cooperation with the camera body 300.

The camera body 300 comprises a mirror unit 370 on a rear side of the body-side mount portion 360. The mirror unit 370 has a main mirror holding frame 372 and a main mirror 371. The main mirror holding frame 372 is pivotally supported by a main mirror rotating axis 373, while holding the main mirror 371.

Furthermore, the mirror unit 370 has a sub-mirror holding frame 375 and a sub-mirror 374. The sub-mirror holding frame 375 is pivotally supported by the main mirror holding frame 372 via a sub-mirror rotating axis 376, while holding the sub-mirror 374. When the main mirror holding frame 372 rotates, the sub-mirror 374 and the sub-mirror holding frame 375 rotate relative to the main mirror holding frame 372, while moving with the main mirror holding frame 372.

In the camera body 300, above the mirror unit 370 in the figure, a focusing screen 352 and a pentaprism 354 are provided one after another. Furthermore, in the camera body 300, behind the pentaprism 354 in the figure, a finder optical system 356 and a photometric sensor 390 are provided. A rear end of the finder optical system 356 is exposed as a finder 350, through a back side of the camera body 300. The photometric sensor 390 detects an intensity of an incident light.

In the camera body 300, behind the mirror unit 370 in the figure, a focal plane shutter 310, an optical filter 332 and an imaging element 330 are provided one after another. The focal plane shutter 310 is opened and closed to open or shield the imaging element 330 against the incident light.

The optical filter 332 is provided just in front of the imaging element 330 to remove an infrared light and an ultraviolet light from the light entering the imaging element 330. Furthermore, the optical filter 332 protects an outer surface of the imaging element 330. Moreover, the optical filter 332 includes a lowpass filter which reduces a space frequency of the incident light. Thereby, the optical filter 332 removes space frequency components exceeding the Nyquist frequency of the imaging element 330 from the incident light to inhibit an occurrence of a moire.

The imaging element 330 is formed of a photoelectric converting element such as a CCD sensor and a CMOS sensor, and receives the light which enters through the optical filter 332. Further behind the imaging element 330, a substrate 320 and a back-side display portion 340 are provided one after another. In the substrate 320, a body-side control portion 322, an image processing portion 324 and the like are implemented. The back-side display portion 340 is formed of a liquid crystal display and the like, and exposed through the back side of the camera body 300.

The main mirror 371 in a state illustrated in the figure is at an observation position obliquely crossing the light entering through the lens unit 600. The main mirror 371 has a reflecting area reflecting the incident light and a half mirror area allowing for a penetration of a portion of the incident light.

A portion of a subject light entering the main mirror 371 at the observation position penetrates the half mirror area and enters the sub-mirror 374. The sub-mirror 374 reflects the incident light downwardly in the figure such that the incident light enters a focusing sensor 382 through a focusing optical system 380 provided below the mirror unit 370 in the figure.

Furthermore, the reflecting area of the main mirror 371 at the observation position reflects the light entering through the lens unit 600 toward the focusing screen 352. The focusing screen 352 is provided at a position optically conjugate to an element arrangement surface of the imaging element 330, and visualizes an image formed by the optical system of the lens unit 600. The subject image produced on the focusing screen 352 is observed as an erect image from the finder 350 through the pentaprism 354 and the finder optical system 356.

A portion of the light emitted from the pentaprism 354 is received by the photometric sensor 390 provided above the finder optical system 356. When a release button of the camera body 300 is in a half-pressed state, the photometric sensor 390 detects the light intensity of the received light.

The body-side control portion 322 calculates a subject brightness in accordance with the detected light intensity, and calculates imaging conditions such as an aperture value, a shutter speed, an ISO sensitivity and the like, in accordance with the calculated subject brightness. Thereby, the camera system 500 can be in a state for imaging a subject under appropriate imaging conditions.

Furthermore, when the release button of the camera body 300 is in the half-pressed state, the focusing sensor 382 detects a defocus amount in the optical system of the lens unit 600, and notifies the body-side control portion 322. The body-side control portion 322 calculates a moving amount of the lens group 630 enough to negate the sensed defocus amount, and notifies the lens-side control portion 650.

The lens-side control portion 650 allows the vibration actuator unit 400 to actuate and actuate the lens group 630, in accordance with the notified moving amount. Thereby, the subject image formed by the optical system of the lens unit 600 is produced on the focusing screen 352 clearly.

In the camera system 500, when the release button is further pressed, the main mirror holding frame 372 rotates with main mirror 371 in a clockwise direction in the figure, and stops at an imaging position in an approximately horizontal state. Thereby, the main mirror 371 retreats from a path of the light entering through the optical system of the lens unit 600.

When the main mirror 371 rotates toward the imaging position, the sub-mirror holding frame 375 also moves upwardly with the main mirror holding frame 372, rotates around the sub-mirror rotating axis 376, and stops at the imaging position in an approximately horizontal state. Thereby, the sub-mirror 374 also retreats from the path of the incident light.

When the main mirror 371 and the sub-mirror 374 move to the imaging position, subsequently, a front curtain of the focal plane shutter 310 is opened. Thereby, the light entering through the optical system of the lens unit 600 passes through the optical filter 332 and is received by the imaging element 330, and imaging is performed. Then, a rear curtain of the focal plane shutter 310 is closed, the main mirror 371 and the sub-mirror 374 return to the observation position again, and a series of operations for imaging are completed.

Note that, though the description has been given of an example of the vibration actuator unit 400 applied to the lens unit 600 in the camera system 500 of a single-lens reflex camera with interchangeable lenses, the vibration actuator unit 400 can be used for moving an optical member in a lens unit of various imaging apparatuses such as a mirrorless camera, a compact camera and a video camera. Besides, not only for an imaging apparatus, the vibration actuator unit 400 can be widely used for an optical apparatus such as a microscope comprising an optical member and for actuating a member which is positioned with a high positioning accuracy. Moreover, not only for an optical apparatus, the vibration actuator unit 400 can be used as an actuator of a stage apparatus and the like.

Figure 22:
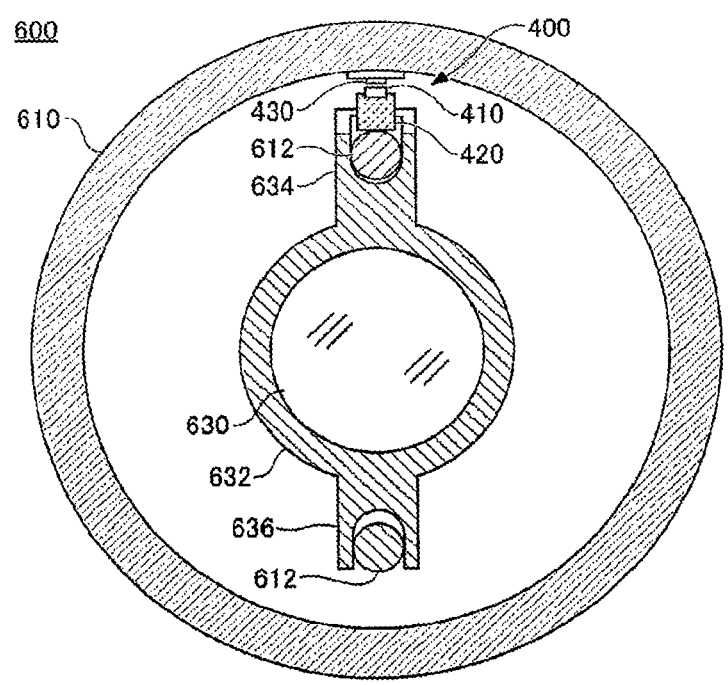
FIG. 22 is a cross sectional view of a lens unit 600.

FIG. 22 is a cross sectional view schematically illustrating a cross section normal to the optical axis X of the lens unit 600. The same reference numerals are applied to elements in common with FIG. 21 and overlapping descriptions are omitted.

In the lens unit 600, the holding frame 632 holding the lens group 630 integrally comprises the interlocking portion 634 at an upper end in the figure. The interlocking portion 634 encompasses the guide axis 612 with the electromechanical converting element 420. Thereby, the holding frame 632 mates with the guide axis 612 in a rotatable state around guide axis 612.

Furthermore, the holding frame 632 integrally comprises the engaging portion 636 at a lower end in the figure. The engaging portion 636 has parallel surfaces having an interval approximately the same as an outer diameter of the guide axis 612 such that the guide axis 612 is sandwiched between the parallel surfaces. Thereby, a lower side of the holding frame 632 is prevented to be displaced parallel to the page and horizontally in the figure. Accordingly, with the interlocking portion 634 and the engaging portion 636, the holding frame 632 is positioned in a direction parallel to the page.

Note that the magnetic sensor 430 is fixed to an inner surface of fixed cylinder 610 to be opposing an upper surface of the biasing portion 410. However, the biasing portion 410 moves, with the holding frame 632, vertically relative to the page. Accordingly, in the direction vertical to the page, the magnetic sensor 430 and the biasing portion 410 are not necessarily opposing each other at the same position.

Figure 23:
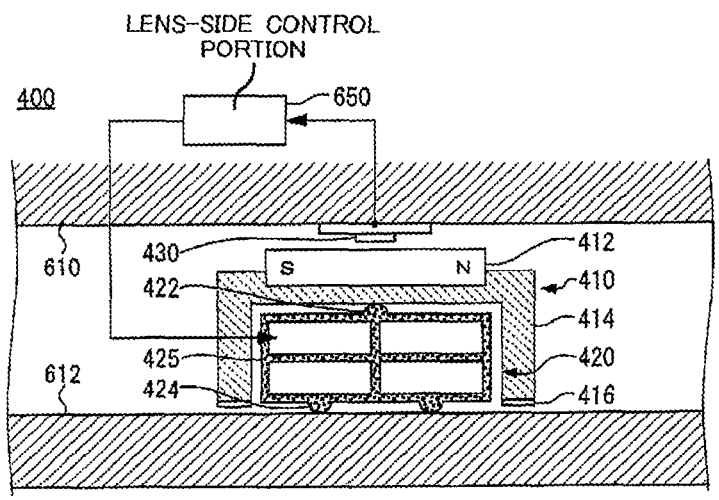
FIG. 23 is a schematic cross sectional view of a vibration actuator unit 400.

FIG. 23 is a schematic view illustrating an overall structure of the vibration actuator unit 400. The same reference numerals are applied to elements in common with FIG. 21 and FIG. 22, and overlapping descriptions are omitted.

The vibration actuator unit 400 has the biasing portion 410, the electromechanical converting element 420 and the magnetic sensor 430. Furthermore, the vibration actuator unit 400 in the lens unit 600 is supplied with an actuating power from the lens-side control portion 650, and actuates under a control of the lens-side control portion 650.

The electromechanical converting element 420 has a support portion 422, contacting portions 424 and a piezoelectric element 425. The piezoelectric element 425 is formed from a piezoelectric material of a cuboid shape. The pair of contacting portions 424 is provided on a lower surface of the piezoelectric element 425 in the figure, and contacts the guide axis 612, respectively.

The support portion 422 is provided on an upper surface of the piezoelectric element 425 in the figure. The support portion 422 contacts the biasing portion 410 from a downward side in the figure, and receives a biasing force from the biasing portion 410. Thereby, the electromechanical converting element 420 is biased downwardly in the figure such that the contacting portions 424 are pressed against the guide axis 612.

The biasing portion 410 includes a permanent magnet 412, a yoke 414 and a buffer member 416. The yoke 414 is formed from a magnetic body material, and provided along the upper surface to the lateral surface of the electromechanical converting element 420 in the figure. A lower end of the yoke 414 is close to, but does not contact the guide axis 612.

The permanent magnet 412 is provided, overlaid on the yoke 414, in a direction such that a magnetic pole is arranged parallel to the guide axis 612. Accordingly, the yoke 414 is also magnetized by the permanent magnet 412. Note that, in the vibration actuator unit 400, the guide axis 612 is also formed from a magnetic body and configures a portion of the biasing portion 410. That is, the magnetic field generated by the permanent magnet 412 forms a magnetic circuit with the yoke 414 and the guide axis 612 each of which is a magnetic body. Thereby, the biasing portion 410 is attracted toward the guide axis 612.

A force attracting the biasing portion 410 toward the guide axis 612 is transmitted, as already described, through the support portion 422 to the electromechanical converting element 420 as a biasing force, and presses the contacting portions 424 against the guide axis 612. Thus, in the vibration actuator unit 400 having the biasing portion 410, with the magnetic force generated by the permanent magnet 412, the electromechanical converting element 420 is precompressed toward the guide axis 612.

Note that, in the vibration actuator unit 400, the buffer member 416 is loaded at a lower end of the yoke 414 to prevent the guide axis 612 from being scratched, when the lower end of the yoke 414 contacts the guide axis 612 for some reasons. Furthermore, by forming the buffer member 416 from a non-magnetic body, the buffer member 416 is prevented from being fastened to the guide axis 612 when contacting the guide axis 612. In consideration of these functions, preferably, the buffer member 416 is formed using a resin material such as a POM resin having elastic and lubricating properties.

In the vibration actuator unit 400, the magnetic sensor 430 detects a magnetic force of the permanent magnet 412 of the biasing portion 410, as a physical amount. Accordingly, when the biasing portion 410 and the electromechanical converting element 420 are displaced relative to the fixed cylinder 610, the magnetic sensor 430 detects a change in the magnetic field. Thereby, the lens-side control portion 650 can recognize a position of the holding frame 632 based on a detection result of the magnetic sensor 430. Accordingly, the lens-side control portion 650 can adjust an actuating power to be supplied to the vibration actuator unit 400 in accordance with the position of the holding frame 632.

Note that, as the magnetic sensor 430, a Hall element, a magnetic impedance element and the like can be used. Furthermore, along the moving route of the vibration actuator unit 400, a plurality of magnetic sensors 430 may be positioned.

Moreover, even though in the example illustrated in the figure, the biasing portion 410 has the single permanent magnet 412, a plurality of permanent magnets 412 may be provided on the yoke 414. Thereby, in the magnetic sensor 430, a periodical change in the magnetic flux density is detected such that a movement amount of the vibration actuator unit 400 is detected with a high accuracy.

Moreover, in the biasing portion 410, instead of the permanent magnet 412, an electromagnet can be used. As the electromagnet can change a strength of the generated magnetic force, the biasing portion 410 using the electromagnet can change the biasing force. However, when the magnetic force of the electromagnet is changed, preferably, the detection result is corrected in accordance with a change in the generated magnetic force magnetic sensor 430.

Figure 24:
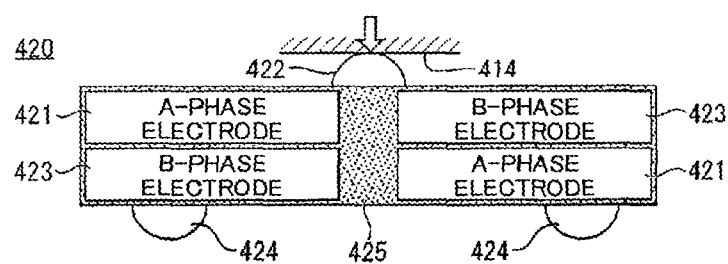
FIG. 24 is a schematic view of an electromechanical converting element 420.

FIG. 24 is a schematic view illustrating one of the electromechanical converting elements 420 enlarged and seen from the lateral surface. The same reference numerals are applied to elements in common with other figures and overlapping descriptions are omitted.

Each of the electromechanical converting elements 420 has a pair of A-phase electrodes 421 and B-phase electrodes 423 provided at diagonally opposing corner positions of the piezoelectric element 425, which configures an approximately rectangular shape when being seen from the lateral surface. The piezoelectric element 425 is formed from a piezoelectric material such as PZT. The A-phase electrodes 421 and the B-phase electrodes 423 are respectively formed from a metal material which has been processed through calcination with the piezoelectric element 425.

Note that piezoelectric element 425 may be formed by layering piezoelectric materials having a layered shape or may be in a bulk state. The dimension of the piezoelectric element 425 formed in this manner may be, for example, about 2 mm on a side, by layering about 10 layers of layered-shape piezoelectric materials.

The A-phase electrodes 421 and the B-phase electrodes 423 are also provided, in a direction vertical to the page, at the corresponding positions on a back surface of the piezoelectric element 425. Accordingly, when an actuating voltage is applied to the A-phase electrodes 421, in an area between the A-phase electrodes 421, the piezoelectric element 425 contracts or extends. Likewise, when an actuating voltage is applied to the B-phase electrodes 423, in an area between the B-phase electrodes 423, the piezoelectric element 425 contracts or extends.

Figure 25:
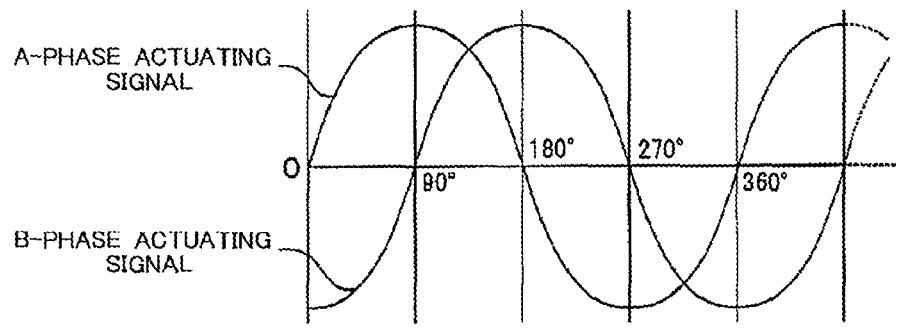
FIG. 25 is a wave pattern diagram of actuating signals.

FIG. 25 is a wave pattern diagram illustrating signal wave patterns of the A-phase actuating signal and the B-phase actuating signal supplied to the electromechanical converting element 420. As illustrated in the figure, the A-phase actuating signal and the B-phase actuating signal are periodically varied. When the A-phase actuating signal has, for example, an electric vibration forming a wave pattern of a sine wave, the B-phase actuating signal generates a sine wave pattern delayed by 90 degrees relative to the A-phase actuating signal, i.e., a voltage signal modulated with a modulation signal having a cosine wave pattern, as the B-phase actuating signal.

Figure 26:
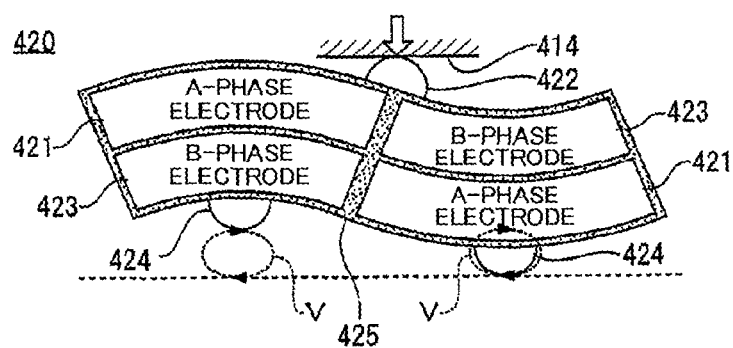
FIG. 26 is a schematic view illustrating an operation of an electromechanical converting element 420.

FIG. 26 is a schematic view illustrating an actuation of the electromechanical converting element 420 which is supplied with the aforementioned A-phase actuating signal and B-phase actuating signal. As described above, as the A-phase actuating signal and the B-phase actuating signal have mutually different phases, in the area provided with the A-phase electrodes 421 and in the area provided with the B-phase electrodes 423, the piezoelectric element 425 shows different extended and contracted states.

In the electromechanical converting element 420, as the A-phase electrodes 421 and the B-phase electrodes 423 are provided adjacent to one another, the aforementioned extension and contraction of the piezoelectric element 425 allow the electromechanical converting element 420 to generate a bending deformation. Furthermore, the electromechanical converting element 420 also generates a deformation at the same time such that the dimension in the longitudinal direction extends and contracts. Thereby, as indicated by an arrow V in the figure, an elliptic vibration is generated such that the contacting portions 424 draw an elliptic orbit in the figure.

Turning back to FIG. 23, the contacting portions 424 of the electromechanical converting element 420 are pressed against the guide axis 612 with the biasing force applied by the biasing portion 410. Accordingly, when the contacting portions 424 generate the aforementioned elliptic vibration, the guide axis 612 is relatively displaced relative to the electromechanical converting element 420.

Note that, in view of the aforementioned actions of the electromechanical converting element 420, preferably, the contacting portions 424 is positioned at anti-node portions of the vibration generated in the electromechanical converting element 420. Thereby, the actuating force generated by the elliptic vibration of the electromechanical converting element 420 is effectively transmitted to the guide axis 612.

In the aforementioned vibration actuator unit 400, the vibration actuator unit 400 integrally moving with the holding frame 632 contacts the guide axis 612 at the contacting portions 424 generating an actuating force, and does not at any other portions. Accordingly, in accordance with the movement of the holding frame 632 actuated by the vibration actuator unit 400, no slide resistance is generated such that the holding frame 632 is smoothly actuated.

Furthermore, in the vibration actuator unit 400, by detecting the magnetic flux density of the magnetic field generated by the permanent magnet 412 which is a portion of the biasing portion 410, an actuating amount of the vibration actuator unit 400 can be detected. Accordingly, without an assembly which occupies a space and costs much such as a linear scale, the actuation amount of the vibration actuator unit 400 can be detected with a high accuracy.

Note that, in the aforementioned example, the permanent magnet 412 is provided in the yoke 414 which moves with the piezoelectric element 425 side. However, a structure is acceptable in which the permanent magnet 412 is provided on the guide axis 612 side to attract the yoke 414 formed by the magnetic body with a magnetic force and generate a biasing force. With such a structure, by positioning the magnetic sensor 430 on the piezoelectric element 425 side, the actuation amount of the vibration actuator unit 400 can be detected.

Figure 27:
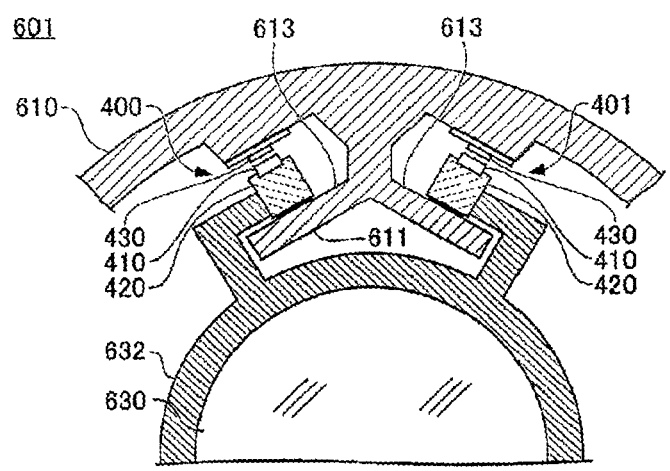
FIG. 27 is a cross sectional view of a lens unit 601.

FIG. 27 is a cross sectional view of another lens unit 601 comprising the vibration actuator unit 400, and shows a cross section normal to the optical axis X. The same reference numerals are applied to elements in common with the embodiments shown in FIG. 26 or the other preceding figures, and overlapping descriptions are omitted.

The lens unit 601 comprises a pair of vibration actuator units 400. Furthermore, the fixed cylinder 610 has, instead of the guide axis 612, a guide rail 611 integrally formed with the fixed cylinder 610. The guide rail 611 extends in a direction vertical to the page, i.e., in a direction parallel to the optical axis X of the lens unit 601, with the cross section in a constant shape.

Thereby, the guide rail 611 forms a pair of flat guide surfaces 613 in the longitudinal direction of the lens unit 601. The pair of guide surfaces 613 has mutually different inclinations relative to a horizontal line in the figure.

Each of the pair of vibration actuator units 400 contacts the pair of guide surfaces 613. Here, in each of the vibration the actuator units 400, as already described, the magnetic force generated by the permanent magnet 412 of the biasing portion 410 presses the contacting portions 424 against the guide surfaces 613 in mutually different directions. Accordingly, the holding frame 632 is positioned, by the pair of vibration actuator units 400 respectively generating adsorption forces to the pair of guide surfaces 613, relative to the fixed cylinder 610 in any directions in the cross section illustrated in the figure.

In other words, in the lens unit 601, the holding frame 632 and the fixed cylinder 610 contact each other at the vibration actuator units 400, and do not at any other portions. Accordingly, when the holding frame 632 is actuated with the actuating forces of the vibration actuator units 400, no slide resistance is generated in accordance with the movement of the holding frame 632 such that the holding frame 632 smoothly moves.

Furthermore, each of the pair of vibration actuator units 400 can detect individually the moving amount with a high accuracy, with the magnetic sensors 430. Accordingly, the actuations of the pair of vibration actuator units 400 can be synchronized to move the holding frame 632 without an inclination relative to the optical axis X.

Figure 28:
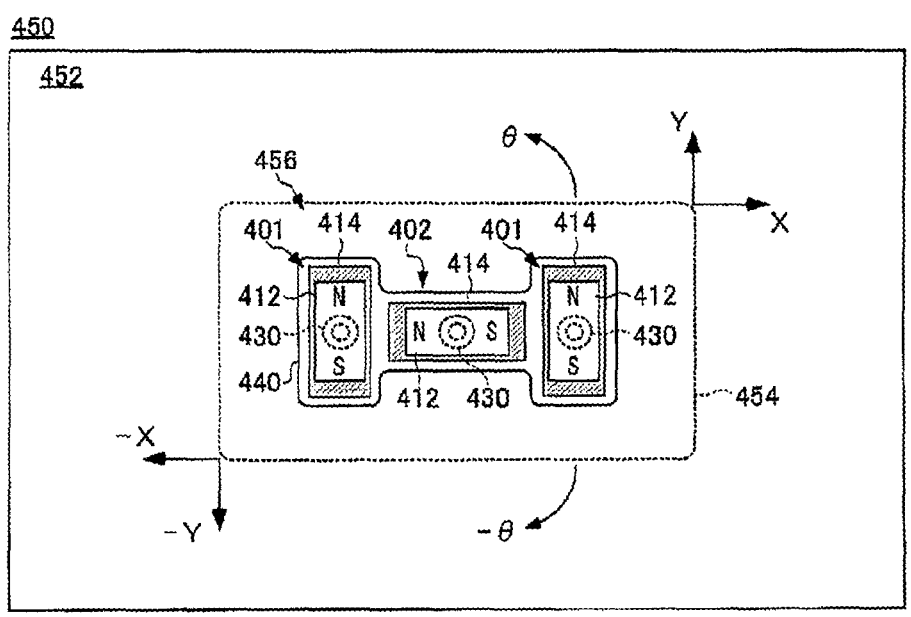
FIG. 28 is a schematic plan view of a stage apparatus 450.

FIG. 28 is a schematic plan view of the stage apparatus 450 comprising the vibration actuator units 401, 402. The stage apparatus 450 comprises a plate 452, a moving stage 454 and an actuating portion 456.

In the stage apparatus 450, the moving stage 454 is provided, via the actuating portion 456, on the fixed plate 452. The moving stage 454 is actuated by the actuating portion 456 to move in a plane direction of the plate 452, relative to the plate 452.

The actuating portion 456 has the plurality of vibration actuator units 401, 402. The individual structure of the vibration actuator units 401, 402 is approximately equivalent to the vibration actuator unit 400 shown in FIG. 23. However, the magnetic sensors 430 are embedded in the plate 452 at positions opposing the permanent magnet 412, respectively.

Furthermore, in the actuating portion 456, a pair of vibration actuator units 401 is provided parallel to a direction indicated by the arrow Y in the figure. Another vibration actuator unit 402 is provided, as indicated by the arrow X in the figure, in a direction normal to the vibration actuator units 401. These vibration actuator units 401, 402 are integrally coupled to each other with a coupling member 440, and further mount the moving stage 454. Accordingly, the moving stage 454 moves on the plate 452 with the actuating portion 456, in accordance with the actions of the actuating portion 456.

In the aforementioned stage apparatus 450, the pair of vibration actuator units 401 is actuated synchronously, and generates the actuating force in the same direction such that the moving stage 454 is translated in the directions indicated by the arrows Y and −Y in the figure. Furthermore, by actuating the another vibration actuator unit 402 to generate the actuating force, the moving stage 454 can be translated in the directions indicated by the arrows X and −X in the figure.

Moreover, in the stage apparatus 450, when the pair of vibration actuator units 401 is actuated differently from each other, as indicated by arrows θ and −θ in the figure, the moving stage 454 can be rotated. In this manner, by combining the plurality of vibration actuator units 401, 402 to form the actuating portion 456, the stage apparatus 450 can be formed with a simplified structure and a high functionality.

Figure 29:
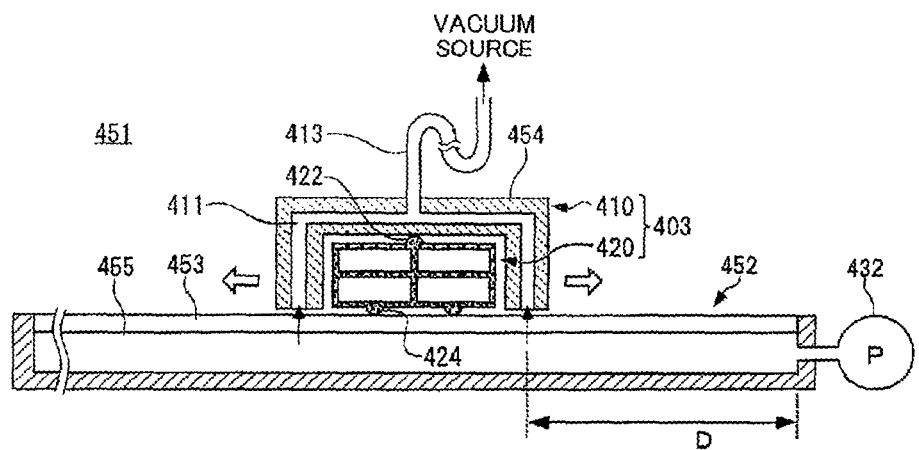
FIG. 29 is a schematic cross sectional view of a stage apparatus 451.
Figure 30:
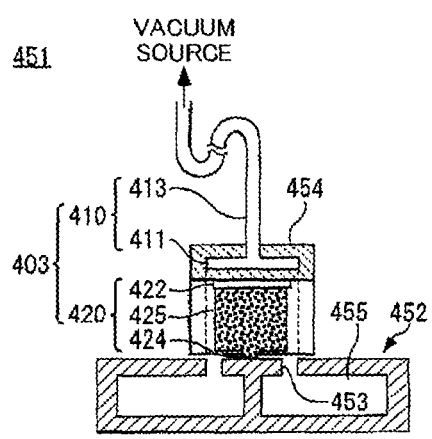
FIG. 30 is a schematic cross sectional view of the stage apparatus 451.

FIG. 29 and FIG. 30 are a schematic cross sectional view of another stage apparatus 451. FIG. 29 shows a cross section of the moving stage 454 taken along the moving direction, and FIG. 30 shows a cross section normal to the cross section in FIG. 29, respectively. The stage apparatus 451 comprises the plate 452, a vibration actuator unit 403 and the moving stage 454.

In the stage apparatus 451, the moving stage 454 is supported by the vibration actuator unit 403 on the fixed plate 452. Thereby, the moving stage 454 is actuated by the vibration actuator unit 403 to move relative to the plate 452 in a plane direction of the plate 452.

The vibration actuator unit 403 has the biasing portion 410 and the electromechanical converting element 420. The structure of the electromechanical converting element 420 is equivalent to the vibration actuator unit 400 illustrated in FIG. 23. Accordingly, the common reference numerals are applied to the same element, and overlapping descriptions are omitted.

The biasing portion 410 has a communication hole 411 having an opening just close to the plate 452. The communication hole 411 is coupled to a vacuum source through the flexible tube 413. Thereby, a negative pressure is also generated at an opening at a lower end of the communication hole 411 to vacuum an outer surface of the plate 452.

In this manner, the biasing portion 410 generates a biasing force to press the contacting portions 424 of the electromechanical converting element 420 against the plate 452. Thereby, when the electromechanical converting element 420 operates, mechanical vibrations of the contacting portions 424 generate an actuating force between the plate 452 and the vibration actuator unit 403 such that the moving stage 454 moves on the plate 452.

Furthermore, in the stage apparatus 451, the plate 452 has a slit 453, a cavity 455 and a pressure sensor 432. The cavity 455 is a hollow space formed inside the plate 452, and allows the slit 453 and the pressure sensor 432 to be in communication with each other. The pressure sensor 432 is, a left edge in the figure, i.e., at a biased position relative to the moving direction of moving stage 454, in communication with the cavity 455.

The slit 453 allows the cavity 455 and outside of the plate 452 to be in communication. Furthermore, the slit 453 is provided, on the outer surface of the plate 452, at a position opposing the opening of the communication hole 411. Accordingly, when the communication hole 411 is in communication with the vacuum source, the communication hole 411 also vacuums an inner air in the slit 453. Thereby, an air in the cavity 455 is also vacuumed such that the pressure in the cavity 455 is also reduced.

The pressure sensor 432 detects a change in an air pressure in such cavity 455.

Moreover, when the vibration actuator unit 403 is actuated and the moving stage 454 moves on the plate 452, the position at which the communication hole 411 and the slit 453 are opposing is changed such that a distance D between the communication hole 411 and the pressure sensor 432 is changed. As the inner air in the cavity 455 has a viscosity, in accordance with a change in the distance D, a pressure in the cavity 455 detected by the pressure sensor 432 differs. More specifically, when the distance D is smaller, the reduced pressure detected by the pressure sensor 432 is larger, and when the distance D is larger, the reduced pressure detected by the pressure sensor 432 is smaller.

In this manner, also in the stage apparatus 451, the vibration actuator unit 403 detects the air pressure which is the physical amount generated by the biasing portion 410 to sense the moving amount. Accordingly, without additional members such as a linear scale and an encoder, the moving amount can be monitored such that the control is performed with a good accuracy.

Note that, also in the stage apparatus 451, like the stage apparatus 450 illustrated in FIG. 28, the actuating portion 456 having a plurality of vibration actuator units 403 oriented in mutually different directions may be provided. Thereby, the moving stage 454 can move two-dimensionally on a plane parallel to the outer surface of the plate 452, and can be rotated on the same plane.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

What is claimed is:

1. A vibration actuator unit comprising:
a converting element that converts an electric vibration of an applied actuating voltage into a mechanical vibration; and
a contact portion that contacts a surface of an actuating subject and transmits a mechanical vibration of the converting element to the surface as an actuating force,
wherein the converting element, when actuating voltages having different phases are input, vibrates the contact portion within a first plane crossing the surface, and vibrates the contact portion within a second plane crossing the first plane,
the converting element comprises a piezoelectric material block polarizing in a common direction and including a plurality of areas, and
the plurality of areas includes two areas provided in a direction crossing a polarization axis and along with the first plane and another two areas provided in a direction crossing the polarization axis and along with the second plane.

2. The vibration actuator unit according to claim 1, wherein the converting element comprises:
a pair of electrodes provided along the first plane and applying an individual actuating voltage to a piezoelectric material; and another pair of electrodes provided along the second plane and applying an individual actuating voltage to a piezoelectric material.

3. The vibration actuator unit according to claim 1, wherein the piezoelectric material block includes the four areas into which the piezoelectric material block is quartered in a circumferential direction within a plane crossing the polarization axis direction; and the converting element further comprises: four electrodes individually supplying actuating voltage to the four areas, wherein the vibration actuator unit supplies to the four electrodes, actuating voltages each of which is vibrated at a unique phase, in order to generate in a multiple manner, on the piezoelectric material block, a vibration within the first plane and a vibration within the second plane.

4. The vibration actuator unit according to claim 1, wherein the converting element further comprises:

a piezoelectric material block of a hexahedron shape, polarizing in a predetermined common direction and having eight areas each of which includes one of eight apexes; and four pairs of electrodes applying a common actuating voltage to a pair of diagonally opposing areas of the eight areas, and the vibration actuator unit supplies to the four pairs of electrodes, actuating voltages each of which is vibrated at a unique phase, in order to generate in a multiple manner, on the piezoelectric material block of the hexahedron shape, a vibration within the first plane and a vibration within the second plane.

5. The vibration actuator unit according to claim 1, wherein the converting element further comprises:

a further piezoelectric material block polarizing in a predetermined common direction, and including a first area and a second area arranged in a polarization axis direction;

a pair of first electrodes applying, when a first actuating voltage having different vibration phases is supplied, the first actuating voltage to the first area to generate, on the further piezoelectric material block in the first area, a vibration within the first plane; and a pair of second electrodes applying, when a second actuating voltage being different from the first actuating voltage and having vibration phases different from each other is supplied, the second actuating voltage to the second area to generate, on the further piezoelectric material block in the second area, a vibration within the second plane.

6. A stage apparatus comprising the vibration actuator unit according to claim 1.

7. An optical apparatus comprising the vibration actuator unit according to claim 1.

8. A vibration actuator unit comprising:

a converting element that converts an electric vibration of an applied actuating voltage into a mechanical vibration; and a contact portion that contacts a surface of an actuating subject and transmits a mechanical vibration of the converting element to the actuated surface as an actuating force, wherein the converting element, when actuating voltages of different phases are input, periodically bends within a first plane crossing the surface to vibrate the contact portion within the first plane, and periodically bends within a second plane crossing the first plane to vibrate the contact portion within the second plane, and wherein the converting element comprises:

a piezoelectric material block of a hexahedron shape, polarizing in a predetermined common direction and having eight areas each of which includes one of eight apexes; and four pairs of electrodes applying a common actuating voltage to a pair of diagonally opposing areas of the eight areas, and wherein the vibration actuator unit supplies to the four pairs of electrodes, actuating voltages each of which is vibrated at a unique phase, in order to generate in a multiple manner, on the piezoelectric material block, a vibration within the first plane and a vibration within the second plane.

9. The vibration actuator unit according to claim 8, wherein the converting element further comprises:

a pair of electrodes provided along the first plane and applying an individual actuating voltage to a piezoelectric material; and another pair of electrodes provided along the second plane and applying an individual actuating voltage to a piezoelectric material.

10. An optical apparatus comprising the vibration actuator unit according to claim 8.

* * * * *